(12) United States Patent
Irie

(10) Patent No.: US 7,531,868 B2
(45) Date of Patent: May 12, 2009

(54) NON-VOLATILE SEMICONDUCTOR MEMORY DEVICE

(75) Inventor: Yasuo Irie, Tokorozawa (JP)

(73) Assignee: Citizen Holdings Co., Ltd., Tokyo (JP)

( * ) Notice: Subject to any disclaimer, the term of this patent is extended or adjusted under 35 U.S.C. 154(b) by 248 days.

(21) Appl. No.: 11/523,801

(22) Filed: Sep. 20, 2006

(65) Prior Publication Data
US 2007/0075352 A1 Apr. 5, 2007

(30) Foreign Application Priority Data
Sep. 21, 2005 (JP) .............................. 2005-273448

(51) Int. Cl.
*H01L 29/792* (2006.01)
(52) U.S. Cl. ............... 257/324; 257/411; 257/E29.309; 438/261
(58) Field of Classification Search ................. 257/324, 257/411, E29.309
See application file for complete search history.

(56) References Cited

U.S. PATENT DOCUMENTS 5,422,205 A * 6/1995 Inoue et al. ..................... 430/5
6,121,666 A * 9/2000 Burr ............................. 257/408
2005/0205923 A1 9/2005 Han et al.

FOREIGN PATENT DOCUMENTS

JP 2004-214365 A 7/2004

* cited by examiner

Primary Examiner—Jerome Jackson, Jr.
Assistant Examiner—Paul A Budd
(74) Attorney, Agent, or Firm—Westerman, Hattori, Daniels & Adrian, LLP.

(57) ABSTRACT

In a non-volatile semiconductor memory device typically of a MONOS type storing data by trapping charge in a multilayer film composed of a plurality of insulating films, which includes: source and drain regions of a second conductivity type disposed apart from each other in a semiconductor substrate of a first conductivity type; and a multilayer film composed of a plurality of insulating films and disposed on top of a channel region between the source and drain regions, a heavily doped region higher in impurity concentration than the semiconductor substrate is provided in part of the channel region to be in contact with only one of the source and drain regions, and in an uppermost top oxide film of the multilayer film on the channel region, only a portion overlapping with the heavily doped region in a plane view is smaller in thickness than the other portion, whereby a stepped portion is formed.

6 Claims, 13 Drawing Sheets

FIG. 6

| | NOR TYPE CIRCUIT | | NAND TYPE CIRCUIT | | THIS INVENTION | |
|---|---|---|---|---|---|---|
| | CHE INJECTION | | FN WRITING | | CHE INJECTION | HOLE INJECTION |
| | Write | Erase | Write | Erase | Write | Erase |
| VG | HV | NV | HV | 0 | HV | HHV |
| VD | HV | HV | 0 | HV | HV | 0 |
| VS | 0 | Open | 0 | HV | 0 | 0 |
| VB | 0 | 0 | 0 | HV | 0 | 0 |

HV: POSITIVE VOLTAGE
NV: NEGATIVE VOLTAGE
HV: POSITIVE VOLTAGE HV<HHV

FIG. 7

| | NOR TYPE CIRCUIT | | NAND TYPE CIRCUIT | | THIS INVENTION | |
|---|---|---|---|---|---|---|
| | CHE INJECTION | | FN WRITING | | CHE INJECTION | HOLE INJECTION |
| | Write | Erase | Write | Erase | Write | Erase |
| VG | +4V | -3V | +7V | 0 | +4V | +8V |
| VD | +3V | +5V | 0 | +7V | +3V | 0 |
| VS | 0 | 0 | 0 | +7V | 0 | 0 |
| VB | 0 | 0 | 0 | +7V | 0 | 0 |

NON-VOLATILE SEMICONDUCTOR MEMORY DEVICE

BACKGROUND OF THE INVENTION

1. Field of the Invention

The invention relates to a non-volatile semiconductor memory device which stores data by trapping charge in a multilayer film composed of a plurality of insulating films, a fabricating method of the same, and a semiconductor memory system including the non-volatile semiconductor memory device and a power supply unit.

2. Description of the Related Art

A non-volatile semiconductor memory stores data by storing charge in a charge storage film. EEPROMs (Electronically Erasable and Programmable Read Only Memories) are roughly classified into two kinds of structures whose charge storage films are different in kinds from each other. One is a FG (Floating Gate) type in which a conductor called a floating gate serving as a charge storage film which is surrounded by an oxide film or the like to be electrically insulated is provided on a gate insulation film, and charge is stored in the floating gate. The other is a MNOS (Metal-Nitride-Oxide-Silicon) type or a MONOS (Metal-Oxide-Nitride-Oxide-Silicon) type that has a charge storage film composed of a plurality of stacked insulating films and stores data by controlling an amount of charge stored in a charge trap in the charge storage film.

To store charge in a charge storage film, there are a FN (Fowler-Nordheim tunneling) writing method utilizing a tunnel effect of the charge in the insulating films and a method called CHE (Channel Hot Electron) injection that energetically excites the charge up to a degree so that the charge can cross over an insulating barrier of the insulating film on the bottom layer. There have been many proposals for this method of injecting the excited charge (see, for example, JP2004-214365A).

A prior art disclosed in JP2004-214365A will now be described. FIG. 23 is a schematic cross-sectional view to illustrate the structure of a MONOS-type non-volatile semiconductor memory device which is one of the EEPROMs, and certain changes are made in the drawing for easier explanation within a range not departing from the spirit of the prior art disclosed in JP2004-214365A.

In FIG. 23, each numeral denotes that 10 is a MONOS-type non-volatile semiconductor memory device, 11 is a p-type semiconductor substrate, 12 is an n-type source region, 13 is an n-type drain region, 24 is a multilayer film composed of three layers of insulating films, and 15 is a gate electrode.

The multilayer film 24 is composed of a tunnel oxide film 241 that is the closest to the semiconductor substrate 11, a memory nitride film 242 being a silicon nitride film on an intermediate layer, and a top oxide film 243 provided on the uppermost layer.

In the semiconductor substrate 11 of the non-volatile semiconductor memory device 10, a p-type heavily doped region 16 higher in impurity concentration than the semiconductor substrate 11 is further provided in an end portion in contact with the drain region 13, in a channel region 17 between the source region 12 and the drain region 13. The multilayer film 24 is provided on top of the channel region 17.

At the time of data write, with a potential of the source region 12 being a reference, a writing drain voltage is applied to the drain region 13 and a writing gate voltage is applied to the gate electrode 15. Consequently, electrons being minority carriers for the p-type semiconductor substrate 11 are supplied from the source region 12 whose potential is used as the reference. The minority carriers are accelerated by an electric field in a channel direction in the channel region 17. In the channel region, the minority carriers gain high energy in the vicinity of the end of the drain region 13, so that the minority carriers cross over a potential barrier of the tunnel oxide film 241 of the multilayer film 24 and are injected to the multilayer film 24 to be stored in the memory nitride film 242.

At this time, in the channel region 17, concentration of the electric field in the channel direction becomes high in the vicinity of the end of the drain region 13 due to the existence of the heavily doped region 16, so that a larger amount of the charge is efficiently injected to the multilayer film 24 to be stored in the memory nitride film 242.

At the time of data read, with a potential of one of the source region 12 and the drain region 13 being a reference, a reading voltage is applied to the other and a reading gate voltage is applied to the gate electrode 15. Since a threshold value of the gate voltage at which a current starts to flow between the source region 12 and the drain region 13 changes according to an amount of the charge stored in the multilayer film 24, it is possible to determine whether or not there exists stored data (to read the stored data), based on the magnitude or the existence or not of the source-drain current when the reading voltage is applied to the MONOS-type non-volatile semiconductor memory device in the above-described manner.

Similarly to the time of writing, due to the existence of the heavily doped region 16, the concentration of the electric field in the channel direction also becomes higher in part at this time, but no energy high enough for the electrons to cross over the potential barrier of the tunnel oxide film 241 is given, and thus erroneous write is prevented.

At the time of data erase, with a potential of the semiconductor substrate 11 being a reference, a positive voltage is applied to the drain region 13 and a negative voltage is applied to the gate electrode 15.

Consequently, charge (holes) opposite in polarity to the written charge (electrons) is supplied into the multilayer film 24 from the drain region 13 and the charges different in polarity are coupled in the memory nitride film 242 to be neutralized, whereby data is erased.

The prior art disclosed in this patent document is capable of realizing a decrease in writing voltage since a larger amount of charge is efficiently injected to the multilayer film 24 at the time of data write owing to the existence of the heavily doped region 16. Another characteristic thereof is that at the time of reading, no unnecessary charge is injected to the multilayer film 24 and therefore, no erroneous write occurs.

As described above, the non-volatile semiconductor memory device includes the heavily doped region 16, thereby improving efficiency of the injection of the charge to the multilayer film 24 on top of the heavily doped region 16, but to further improve the efficiency at the time of data write, the writing gate voltage applied to the gate electrode 15 has to be made higher. As a result, an amount of the charge injected to the multilayer film 24 on top of the heavily doped region 16 increases.

However, since the thickness of the multilayer film 24 is uniform on the whole channel region 17, a high electric field is applied to the whole channel region. Consequently, there is a certain probability that the charge (electrons) is injected to the multilayer film 24 from a region before reaching the heavily doped region 16, even though the charge should be injected to the multilayer film 24 after gaining higher energy near the heavily doped region 16 close to the end of the drain region 13 in the channel region 17.

The increase in the writing gate voltage applied to the gate electrode 15 also increases its difference from the writing drain voltage applied to the drain region 13, so that the charge generated in the vicinity of the source region 12 is not accelerated sufficiently due to an electric field in a direction orthogonal to the electric field in the channel direction of the channel region 17. Consequently, even if the charge reaches the vicinity of the drain region 13, it cannot gain energy high enough to cross over the potential barrier of the multilayer film 24, which may possibly prevent normal write itself.

If normal injection of the charge to a predetermined portion of the multilayer film 24 thus decreases and the charge is injected to an unintended portion, a threshold value of the non-volatile semiconductor memory device becomes different from that when normal write is performed.

Since such a situation is a kind of erroneous write and data is not normally written, a write state is not stable and the threshold value after the write cannot be controlled.

A write state or an erase state of a non-volatile semiconductor memory device is known from a change in its threshold value. That is, based on a range in which the threshold value falls, the meaning of written data is determined. Therefore, if the threshold value becomes an unintended value, the meaning of the data becomes erroneous at an instant the data is written, or a margin for fluctuation of the threshold value with the elapse of time, that is, a data retention characteristic, deteriorates. In either case, reliability as a storage device deteriorates.

Further, as for semiconductor devices in recent years, a demand for a lower driving voltage is arising in accordance with the miniaturization and increase in integration density of semiconductor elements. Non-volatile semiconductor memory devices are also under the same circumstances, but as for the memory devices, there is also a demand for a decrease in writing voltage and erasing voltage. However, increasing the writing gate voltage for higher efficiency of data write as described above is contrary to the demand.

Therefore, such a non-volatile semiconductor memory device had problems that, for executing more efficient write, it is necessary to increase a writing gate voltage applied to a gate electrode, and as a result, the non-volatile semiconductor memory device becomes unstable and cannot respond to the demand for a lower voltage that has arisen in accordance with the miniaturization of the recent semiconductor devices.

Further, a multi-level memory has been drawing attention as a non-volatile semiconductor memory. The multi-level memory, which stores a plurality of data in one memory element, can store a larger data volume in each memory element, and therefore has been drawing attention as an art that can dramatically increase a data storage amount even with the same integration degree of memory chips.

However, the above-described non-volatile semiconductor memory device cannot be used as a multi-level memory.

SUMMARY OF THE INVENTION

The invention was made to solve the above-described problems and a common object thereof is to make it possible to write data by efficiently injecting charge to a multilayer film without increasing a writing voltage applied to a gate electrode, in a non-volatile semiconductor memory device, typically, of a MONOS type, that stores data by trapping the charge in the multilayer film composed of a plurality of insulating films. Other objects are to make it possible to use the non-volatile semiconductor memory as a multi-level memory capable of high-density storage of data, to read stored data without any application of a voltage to the gate electrode, and to provide a semiconductor memory system in which the structure of a power supply unit for data write and erase is simplified.

A non-volatile semiconductor memory device according to the invention is a non-volatile semiconductor memory device including: a first diffused region and a second diffused region of a second conductivity type which are disposed apart from each other near a surface of a semiconductor substrate of a first conductivity type; a multilayer film provided on top of a channel region between the first diffused region and the second diffused region and composed of a plurality of stacked insulating films; and a gate electrode provided on top of the multilayer film, and has the following structure in order to attain the above common object.

At least one third diffused region of the first conductivity type which is in contact with only one of the first diffused region and the second diffused region and is higher in impurity concentration than the semiconductor substrate is provided in part of the channel region, and in an insulating film on an uppermost layer out of the plural insulating films composing the multilayer film, only a portion overlapping with the third diffused region in a plane view is smaller in thickness than a portion not overlapping with the third diffused region in the plane view.

By providing the third diffused region in each of a region in contact only with the first diffused region and a region in contact only with the second diffused region, it is possible to realize a multi-level memory capable of storing 2-bit data.

Preferably, the insulating film on the uppermost layer composing the multilayer film has a stepped portion above a boundary portion between the channel region and the third diffused region.

Preferably, the multilayer film is composed of a tunnel oxide film, a memory nitride film, and a top oxide film which are stacked in order from a bottom layer, and the top oxide film is the insulating film on the uppermost layer.

In these non-volatile semiconductor memory devices, preferably, a fourth diffused region of the second conductivity type lower in impurity concentration than the first diffused region and the second diffused region is provided in a region in which the third diffused region is not provided, in the channel region between the first diffused region and the second diffused region.

A semiconductor memory system according to the invention includes: any of the non-volatile semiconductor memory devices described above; and a power supply unit generating voltages with same polarity as a writing voltage that is applied in case of write it is said data is written to the non-volatile semiconductor memory device and as an erasing voltage that is applied in case of erase it is said written data is erased.

Preferably, the power supply unit includes: a grounding circuit constantly setting a potential of the semiconductor substrate of the non-volatile semiconductor memory device to a ground potential; a writing voltage generating circuit which generates positive or negative writing voltages that are to be applied to the first diffused region or the second diffused region and to the gate electrode at the time of writing; and an erasing voltage generating circuit which generates an erasing voltage larger in absolute value than the writing voltages and same in polarity as the writing voltages, to apply the erasing voltage to the gate electrode at the time of erasing.

A fabricating method of a non-volatile semiconductor memory device according to the invention is characterized in that it has the following steps:

forming a source region and a drain region by diffused regions of a second conductivity type apart from each other near a surface of a semiconductor substrate of a first conductivity type;

forming at least one heavily doped region of the first conductivity type higher in impurity concentration than the semiconductor substrate in part of a region between the source region and the drain region of the semiconductor substrate, so as to bring the heavily doped region into contact only with one of the source region and the drain region;

forming a multilayer film by laminating a plurality of insulating films on a region between the source region and the drain region of the semiconductor substrate, and in an insulating film on an uppermost layer composing the multilayer film, making a portion where the multilayer film and the heavily doped region overlap with each other in a plane view smaller in thickness than the other portion; and forming a gate electrode on top of the multilayer film.

Alternatively, a fabricating method of a non-volatile semiconductor memory device according to the invention may include the following steps:

forming one heavily doped region or forming two heavily doped regions apart from each other, near a surface of a semiconductor substrate of a first conductivity type, the heavily doped region being of the first conductivity type and higher in impurity concentration than the semiconductor substrate;

forming a multilayer film by laminating a plurality of insulating films on a region, of the semiconductor substrate, between two regions where a source region and a drain region apart from each other are to be formed in a post-process, and in an insulating film on an uppermost layer composing the multilayer film, making a portion where the multilayer film overlaps with the heavily doped region in a plane view smaller in thickness than the other portion;

forming a gate electrode on top of the multilayer film;

forming, near a surface of the semiconductor substrate, the source region and the drain region by diffused regions of a second conductivity type which face each other at an interval across the heavily doped region(s), so as to bring only one of the source region and the drain region into contact with the heavily doped region in a case where the single heavily doped region is provided, and so as to bring the source region into contact with only one of the heavily doped regions and bring the drain region into contact with only the other heavily doped region in a case where the two heavily doped regions are provided.

Preferably, each of these fabricating methods of the non-volatile semiconductor memory device further includes the step of forming a diffused region of the second conductivity type lower in impurity concentration than the source region and the drain region, in a region not provided with the heavily doped region, in the region between the source region and the drain region of the semiconductor substrate.

According to the non-volatile semiconductor memory device according to the invention, since in the insulating film on the uppermost layer out of the plural insulating films composing the multilayer film, only the portion overlapping with the third diffused region in the plane view is made smaller in thickness than the portion not overlapping with the third diffused region, it is possible to apply a stronger electric field from a gate electrode to the portion above the third diffused region at the time of data write, which consequently produces an effect of improving efficiency of charge injection to the portion, of the multilayer film, overlapping with the third diffused region in the plane view.

Therefore, even when the writing gate voltage applied to the gate electrode is fixed, since a stronger electric field is applied only to the portion above the third diffused region in the channel region, it is possible to efficiently inject charge to the portion of the multilayer film on the third diffused region to store the charge in an intermediate layer thereof, and there occurs no unexpected erroneous write in the other portion of the channel region.

Therefore, even if the writing gate voltage is decreased, data can be normally written to a portion of the multilayer film on a predetermined portion of the channel region, that is the third diffused region, which makes it possible to cope with the recent lowering the voltage of semiconductor devices.

Moreover, providing the third diffused regions independently on the source region side and the drain region side respectively makes it possible to store charge in either of both end portions of the multilayer film by interchanging a condition of voltage application to the source region and that to the drain region at the time of writing. That is, it is possible to handle the both end portions of the multilayer film as independent bits, which can realize a 2-bit memory being a multi-level memory.

The multi-level memory requires the injection of a predetermined amount of charge only to a predetermined portion of a memory element, and the non-volatile semiconductor memory device of the invention is suitable as the multi-level memory since there occurs no erroneous write to portions except the portion above the third diffused region being the predetermined portion.

Further, the fourth diffused region of the second conductivity type lower in concentration than the first diffused region and the second diffused region is provided in the region in the channel region where the third diffused region is not provided, which makes it possible to lower the threshold value after the erase to 0 V or lower to cause depletion, and therefore, it is possible to read stored data without applying any voltage to the gate electrode. This can prevent deterioration of the stored data due to erroneous write.

According to the semiconductor memory system of the invention, since the writing voltages applied when data is written to the non-volatile semiconductor memory device and the erasing voltage applied when data is erased are all voltages with the same polarity, the structure of the power supply unit for data write and erase can be simplified.

Further, since the potential of the semiconductor substrate can be constantly set to 0 V, no element isolation by insulating films is required when a plurality of elements are formed on the same semiconductor substrate, which can enhance space efficiency of a semiconductor device.

According to the fabricating method of the non-volatile semiconductor memory device of the invention, it is possible to fabricate the non-volatile semiconductor memory device efficiently and at low cost.

The above and other objects, features and advantages of the invention will be apparent from the following detailed description which is to be read in conjunction with the accompanying drawings.

BRIEF DESCRIPTION OF THE DRAWINGS

FIG. 6 is a table showing types of voltages applied to respective portions at the time of writing and the time of erasing in the non-volatile semiconductor memory device according to the invention, in comparison to those in typical non-volatile semiconductor memory devices;

FIG. 7 is a table showing concrete examples of the voltages shown in FIG. 6;

DETAILED DESCRIPTION OF THE PREFERRED EMBODIMENTS

Figure 1:
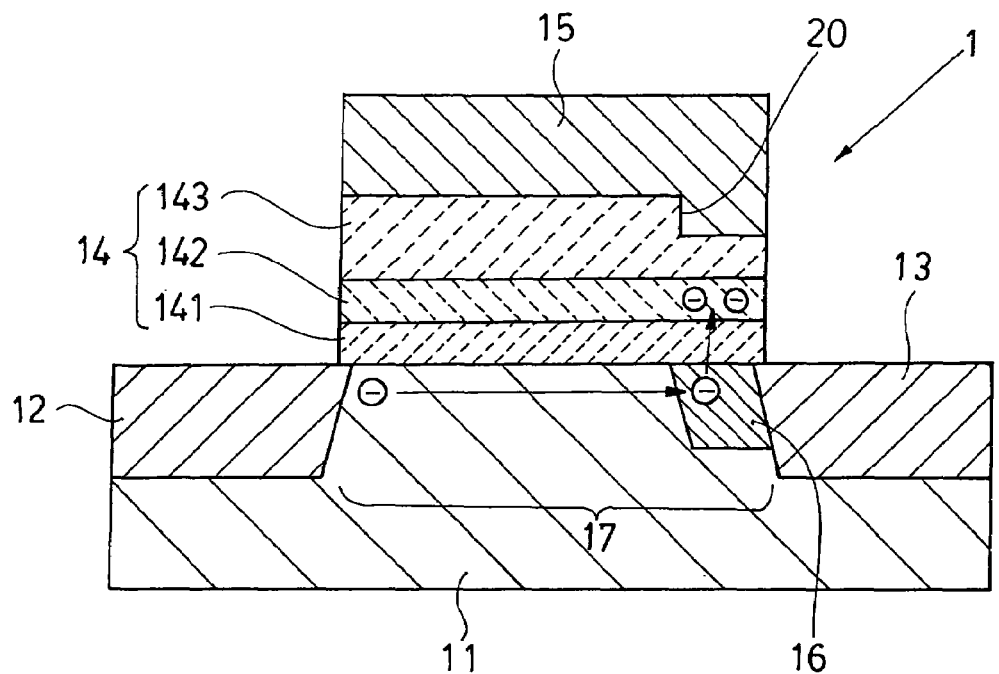
FIG. 1 to FIG. 4 are schematic cross-sectional views to illustrate a first embodiment to a fourth embodiment of a non-volatile semiconductor memory device according to the invention, respectively.

First Embodiment of Non-volatile Semiconductor Memory Device: FIG. 1

FIG. 1 is a schematic cross-sectional view to illustrate a first embodiment of a non-volatile semiconductor memory device according to the invention.

In FIG. 1, each numeral denotes that 1 is a MONOS-type non-volatile semiconductor memory device, 11 is a semiconductor substrate of a first conductivity type (p-type here), 12 is a source region being a first diffused region of a second conductivity type (n-type here) which is opposite to the conductivity type of the semiconductor substrate 11, and 13 is a drain region being a second diffused region also of the second type (n-type).

The source region 12 and the drain region 13 are formed near a surface of the semiconductor substrate 11 to be a predetermined interval apart from each other. A region between the source region 12 and the drain region 13 of the semiconductor substrate 11 is a channel region 17, and on the channel region 17, a multilayer film 14 composed of a plurality of stacked insulating films is provided. A gate electrode 15 is provided on the multilayer film 14.

In a surface layer portion of the channel region 17 of the semiconductor substrate 11, provided is a heavily doped region 16 in contact only with the drain region 13 out of the source region 12 and the drain region 13. The heavily doped region 16 is a third diffused region which is of the p-type being the first conductivity type and is higher in impurity concentration than the semiconductor substrate 11.

As the plural layers of insulating films of the multilayer film 14, a tunnel oxide film 141 on a bottom layer in contact with the semiconductor substrate 11, a memory nitride film 142 being a silicon nitride film on an intermediate layer, and a top oxide film 143 on an uppermost layer are stacked in this order.

In the top oxide film 143 being the insulating film on the uppermost layer, only a portion overlapping, in a plane view, with the heavily doped region 16 being the third diffused region is smaller in thickness than a portion thereof not overlapping, in the plane view, with the heavily doped region 16. In the example shown in FIG. 1, the thickness of a drain region 13 side is smaller and the thickness of the other portion is larger. That is, the top oxide film 143 has a stepped portion 20 at a position above a boundary portion between a region having the heavily doped region 16 and a region not having the heavily doped region 16 in the channel region 17.

The stepped portion 20 is a surface in a thickness direction formed by a steep difference in thickness between the thick portion and the thin portion of the top oxide film 143.

The layers other than the top oxide film 143, namely, the tunnel oxide film 141 and the memory nitride film 142 have uniform thickness all over the channel region 17. The gate electrode 15 is formed on the top oxide film 143 including the thin portion of the top oxide film 143.

The non-volatile semiconductor memory device of the invention is characterized in that the heavily doped region 16 in contact only with one of the source region 12 and the drain region 13 is provided in part of the channel region, and in the top oxide film 143 being the uppermost layer of the multilayer film 14, only the portion above the heavily doped region 16 is thinner than the other portion.

Therefore, a mirror-reversed structure of the structure in FIG. 1 is also possible, that is, the heavily doped region 16 may be provided so as to be in contact only with the source region 12, and the portion of the top oxide film 143 above the heavily doped region 16 may be made thinner than the other portion.

Further, the heavily doped region 16 may be provided independently on each of the source region 12 side and the drain region 13 side, which will be described in a second embodiment to follow.

Next, the operation of the non-volatile semiconductor memory device 1 of this embodiment will be described by still using FIG. 1. In the description here, a case where the heavily doped region 16 is provided on the drain region 13 side as shown in FIG. 1 will be taken as an example.

At the time of data write, with a potential of the source region 12 being a reference, a writing drain voltage is applied to the drain region 13, and a writing gate voltage is applied to the gate electrode 15.

Consequently, electrons being minority carriers for the p-type semiconductor substrate 11 are supplied to the channel region 17 from the source region 12 whose potential is used as the reference, and the minority carriers are accelerated by an electric field in a channel direction in the channel region 17.

The channel direction is an arrow direction directing from left to right in the channel region 17 in FIG. 1. The accelerated minority carriers gain high energy near the drain region 13 in the channel region 17 to cross over a potential barrier of the tunnel oxide film 141 of the multilayer film 14 and are injected to the memory nitride film 142. The injection direction is an upward arrow direction from the heavily doped region 16 in FIG. 1.

The top oxide film 143 has the stepped portion 20, and the stepped portion 20 has an upright vertical end surface. This causes a steep difference in film thickness, whereby a portion to which the electric field of the writing gate voltage is strongly applied and the other portion are more distinctly discriminated. The vertical end surface being the boundary of these portions substantially coincide, in a plane view, with the boundary between the portion having the heavily doped region 16 and the portion without the heavily doped region 16 in the channel region 17.

Therefore, the stronger electric field is applied only to the thin portion of the top oxide film 143, overlapping with the heavily doped region 16 in a plane view, so that charge (negative charge by electrons) is efficiently stored locally in a portion of the multilayer film 14, being the thin portion of the top oxide film 143 corresponding to a right end portion of the gate electrode 15.

Since the place storing the charge in the multilayer film 14 is close to the drain region 13, the multilayer film 14 may have a large thickness near the source region 12. What is important is that in the top oxide film 143, the portion where the heavily doped region 16 and the multilayer film 14 overlap with each other in the plane view is thin.

If the total thickness of the whole multilayer film 14 or the thickness of the top oxide film 143 is large in a portion near the source region 12, an electric field in a direction orthogonal to the channel region 17 weakens in this portion. Therefore, at an initial stage when the minority carriers supplied to the semiconductor substrate 11 from the source region 12 are accelerated, since only the influence of the electric field in the direction of the channel region 17, that is, in the arrow direction directing from left to right in FIG. 1 is strong, it is possible to prevent the charge from being erroneously stored in the portion of the multilayer film 14 near the source region 12.

Voltage conditions of the non-volatile semiconductor memory device 1 of this embodiment, though not limited to specific conditions, are preferably as follows. Here, "gate voltage" is a voltage applied to the gate electrode 15 and "drain voltage" is a voltage applied to the drain region 13.

At the time of writing, for example, the gate voltage is set to +4 V, the drain voltage is set to +3 V, and the source region 12 and the semiconductor substrate 11 are set to 0 V.

At the time of erasing, for example, the gate voltage is set to −3 V, the drain voltage is set to +5 V, and the source region 12 and the semiconductor substrate 11 are set to 0 V.

At the time of reading, for example, the gate voltage is set to +1.5 V, the drain voltage is set to +1.5 V, and the source region 12 and the semiconductor substrate 11 are set to 0 V.

Since the source region 12 and the semiconductor substrate 11 are constantly kept at 0 V (ground potential), even if this non-volatile semiconductor memory device 1 is incorporated in an integrated-type device in which a plurality of elements are formed on the same semiconductor substrate, the voltage of the semiconductor substrate does not change during operation and no influence is given to the other elements, which is desirable.

Even if the writing gate voltage is lowered, data can be surely written, which makes it possible to cope with the recent lowering the voltage in semiconductor devices. Moreover, since the gate voltage at the time of reading can also be low, it is possible to prevent deterioration of stored data due to erroneous write. Since the number of times data is read is far larger than the number of times data is written or erased, erroneous write occurs due to the accumulation of the time of reading even if no erroneous write occurs in each reading. However, lowering the gate voltage at the time of reading makes it possible to make the accumulation time longer.

In a case where the heavily doped region 16 and the portion of the multilayer film 14 where the top oxide film 143 is thin are mirror-reversed from the state in FIG. 1 to be provided on the source region 12 side, the aforethe voltage conditions are changed such that the drain region 13 and the semiconductor substrate 11 are constantly set to 0 V and the drain voltage is changed to the source voltage applied to the source region 12.

Figure 2:
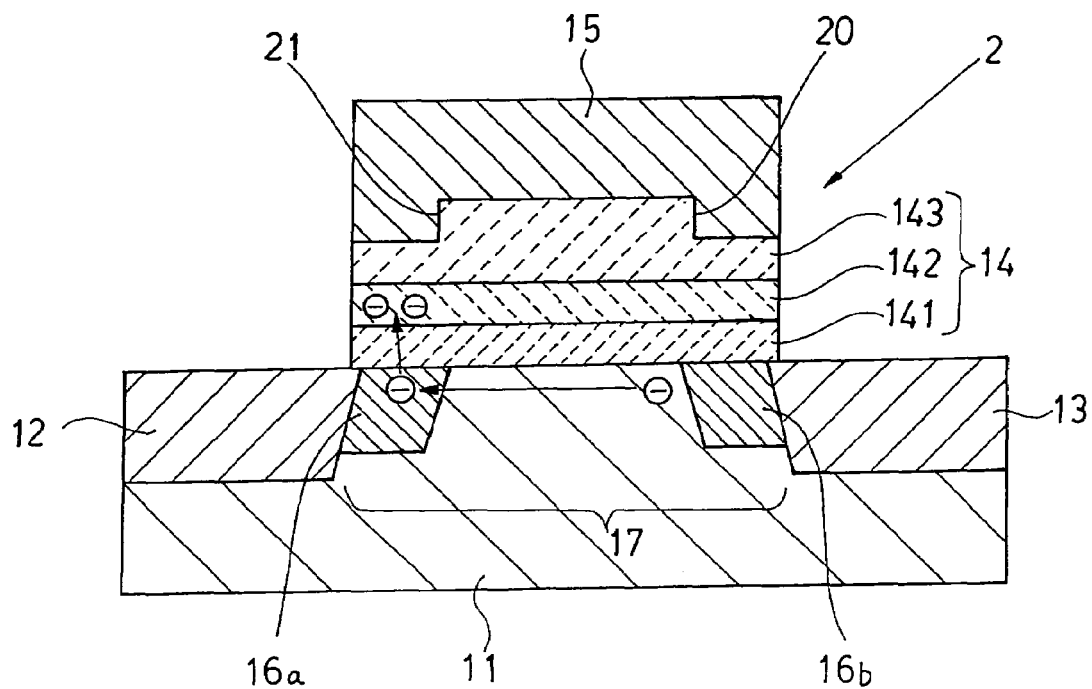

Second Embodiment of Non-volatile Semiconductor Memory Device: FIG. 2

FIG. 2 is a schematic cross-sectional view to illustrate the second embodiment of the non-volatile semiconductor memory device according to the invention. In FIG. 2, the same reference numerals and symbols are used to designate portions corresponding to those in FIG. 1, and description thereof will be omitted. Though a multilayer film 14 is different in the shape of a top oxide film 143 being the insulating film on the uppermost layer thereof from that of the embodiment in FIG. 1, the same reference numeral is used to designate the multilayer 14 for convenience sake.

A MONOS-type non-volatile semiconductor memory device 2 is structured such that in a surface layer portion of a channel region 17 between a source region 12 being a first diffusion layer and a drain region 13 being a second diffused region of a semiconductor substrate 11, a first heavily doped region 16a in contact only with the source region 12 and a second heavily doped region 16b in contact only with the drain region 13 are independently provided as third diffused regions.

In the top oxide film 143 on the uppermost layer out of the plural insulating films composing the multilayer film 14, portions overlapping with the first heavily doped region 16a and the second heavily doped region 16b respectively in a plane view are made thinner than the other portion overlapping with neither the first nor second heavily doped regions 16a, 16b, whereby a stepped portion 21 and a stepped portion 20 are formed above a boundary portion of the heavily doped region 16a and a boundary portion of the second heavily doped region 16b respectively.

With this structure, in a case where a voltage is applied between the semiconductor substrate 11 and a gate electrode 15, an electric field generated in the thin portions of the top oxide film 143 becomes stronger than an electric field generated in the other portion, which makes it possible to inject charge locally to the multilayer film 14 with high efficiency. At this time, since the first heavily doped region 16a and the second heavily doped region 16b are right under these portions, minority carriers gain high energy near the heavily doped regions 16a, 16b of the channel region 17 to be injected to the multilayer film 14 still more efficiently and are stored near both end portions of a memory nitride film 142. Therefore, the non-volatile semiconductor memory device 2 can be used as a 2-bit memory being a multi-level memory using these both end portions as independent memory bits.

Next, the operation of the non-volatile semiconductor memory device 2 as the multi-level memory will be described. Here, a case where data is written to the portion near the source region 12 in the multilayer film 14 will be described. Of course, this write may come either before or after data write to the portion near the drain region 13 in the multilayer film 14 which is previously described in the first embodiment, At the time of data write in this case, with a potential of the drain region 13 being a reference, a writing source voltage is applied to the source region 12 and a writing gate voltage is applied to the gate electrode 15.

Consequently, electrons being the minority carriers for the p-type semiconductor substrate 11 are supplied from the drain region 13 whose potential is used as the reference. The minority carriers are accelerated in an arrow direction directing from right to left in FIG. 2 by an electric field in a channel direction in the channel region 17. The minority carriers gain high energy in the portion near the source region 12 in the channel region 17 to cross over a potential barrier of a tunnel oxide film 141 of the multilayer film 14 and are injected into the multilayer film 14 to be stored in a memory nitride film 142.

At this time, in the same manner as when the data is written to the portion near the drain region 13 in the multilayer film 14, a stronger electric field is generated in the thin portion near the source region 12 in the multilayer film 14 than in the other portion, so that the charge is stored locally in a left end portion of the memory nitride film 142 in the multilayer film 14 with high efficiency.

To erase data stored in the portion near the drain region 13 in the multilayer film 14, with a potential of the semiconductor substrate 11 being a reference, a positive voltage is applied to the drain region 13 and a negative voltage is applied to the gate electrode 15.

Consequently, charge (holes) opposite in polarity to the written charge is supplied into the multilayer film 14 from the drain region 13, so that the charges different in polarity are coupled to be neutralized, whereby the data by the charge stored in the right end portion in FIG. 2 is erased.

To erase data stored in the portion near the source region 12 in the multilayer film 14, with the potential of the semiconductor substrate 11 being a reference, a positive voltage is applied to the source region 12 and a negative voltage is applied to the gate electrode 15.

Consequently, charge opposite in polarity to the written charge is supplied into the multilayer film 14 from the source region 12, so that the data by the charge stored in the left end portion in FIG. 2 is erased.

As described above, according to this embodiment, since charge is stored locally in the both end portions of the multilayer film 14 with high efficiency, the non-volatile semiconductor memory device can be used as a multi-valued (2-bit) memory using the both end portions as independent memory bits.

As a method of reading the written data, any of various methods which have conventionally been tried is applicable, but since this is not unique to the invention, description thereof will be omitted.

Figure 3:
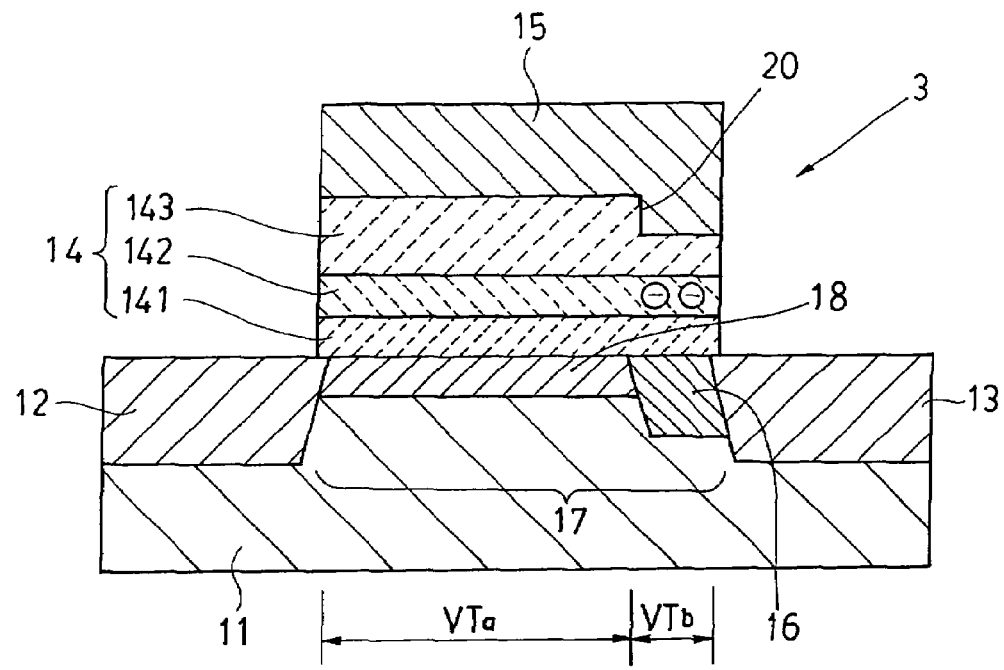
Figure 5:
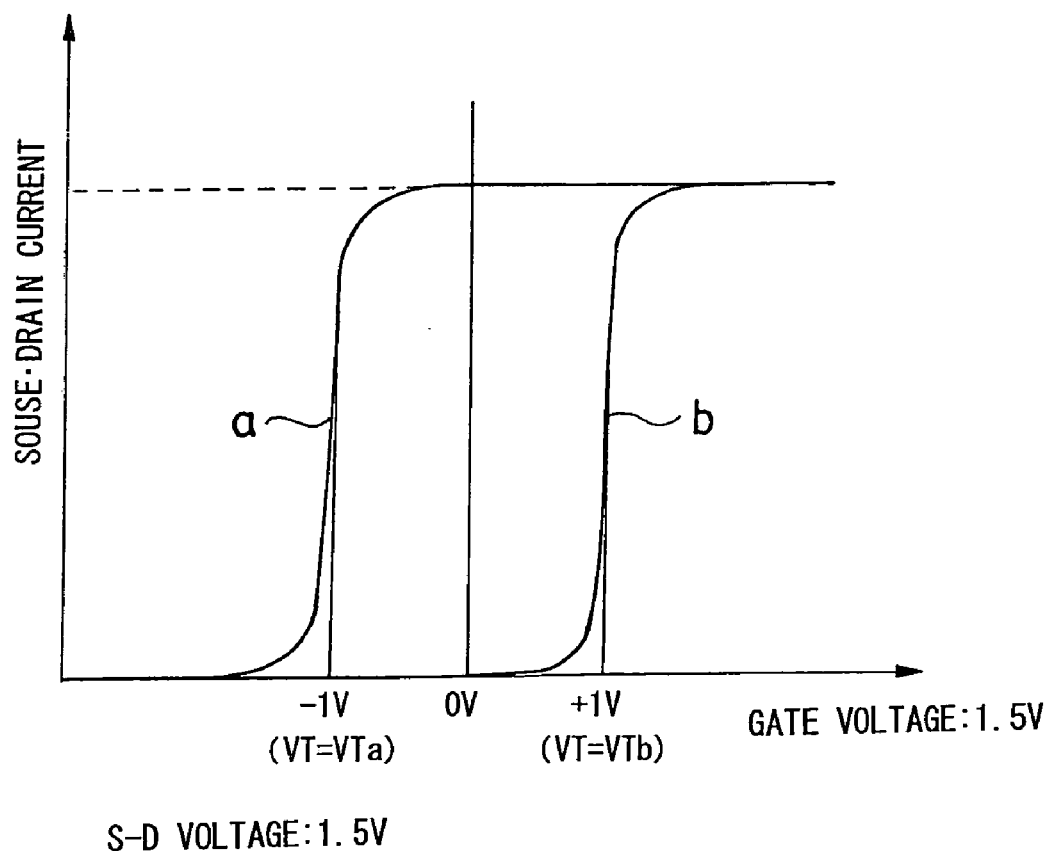
FIG. 5 is a graph showing the correlation between a gate voltage and a source-drain current in a state where a 1.5 V voltage is applied between a source region 12 and a drain region 13 of the non-volatile semiconductor memory device 3 shown in FIG. 3.

Third Embodiment of Non-volatile Semiconductor Memory Device: FIG. 3, FIG. 5

FIG. 3 is a schematic cross-sectional view to illustrate a third embodiment of the non-volatile semiconductor memory device according to the invention. In FIG. 3, the same reference numerals and symbols are also used to designate portions corresponding to those in FIG. 1, and description thereof will be omitted.

The non-volatile semiconductor memory device 3 of the third embodiment has substantially the same structure as that of the non-volatile semiconductor memory device 1 shown in FIG. 1, and is different only in that a fourth diffused region 18 of a second conductivity type (n-type) lower in impurity concentration than a source region 12 being a first diffused region of a semiconductor substrate 11 and a drain region 13 being a second diffused region thereof is provided in an area where a heavily doped region 16 being a third diffused region is not provided, in a surface layer portion of a channel region 17 between the source region 12 and the drain region 13.

In the non-volatile semiconductor memory device 3, due to a difference in impurity concentration in the channel region 17 and a difference in thickness in a multilayer film 14, there exist two different threshold voltages, namely, a threshold voltage VTa in the fourth diffused region 18 and a threshold voltage VTb in the heavily doped region 16 being the third diffused region. Accordingly, a threshold voltage VT as the non-volatile semiconductor memory device 3 has a higher threshold value (plus side) out of the threshold voltages VTa and VTb.

The threshold voltage VTb in the heavily doped region 16 is variable depending on the storage state of charge in the multilayer film 14. Therefore, after data is written thereto, the threshold voltage VTb becomes higher and the threshold voltage VT of the non-volatile semiconductor memory device 3 becomes VT=VTb, and therefore, it is possible to set the threshold voltage VT to a desired value by controlling the storage state of charge in the multilayer film 14.

On the other hand, after the erase, since negative charge stored in the multilayer film 14 is neutralized by the injection of positive charge and the threshold voltage VTb in the heavily doped region 16 comes to have a low value, the threshold voltage VT becomes VT=VTa to have a value determined at the fabrication time of the non-volatile semiconductor memory device 3.

Therefore, by forming the fourth diffused region 18 in the channel region 17, it is possible to lower the threshold voltage VT after the erase to 0 V or lower to cause depletion.

FIG. 5 is a graph showing the correlation between a gate voltage (voltage applied to a gate electrode 15) and a source-drain current (current flowing between the source region 12 and the drain region 13) in a state where a 1.5 V voltage is applied between the source region 12 and the drain region 13 (between S-D) of the non-volatile semiconductor memory device 3. A curve "b" shows a characteristic after data is written and is an example when the threshold voltage VT=VTb is +1 V. A curve "a" shows a characteristic after the erase and is an example when the threshold voltage VT=VTa is −1 V.

By thus setting the threshold voltage after the write to a plus direction and the threshold voltage after the erase to a minus direction, it is possible, at the time of reading, to read (discriminate) data without applying any voltage to the gate electrode 15, which can prevent erroneous write due to the application of a reading voltage. Therefore, it is possible to realize a highly reliable non-volatile semiconductor memory device capable of enduring a large number of repeated reads.

That is, when the gate voltage is set to 0 V in FIG. 5, if the source-drain current flows, this state can be determined as an erase state (no data exists: 0), and if the source-drain current does not flow, this state can be determined as a write state (data exists: 1).

Voltage conditions at the time of writing and at the time of erasing are the same as those of the first embodiment.

Figure 4:
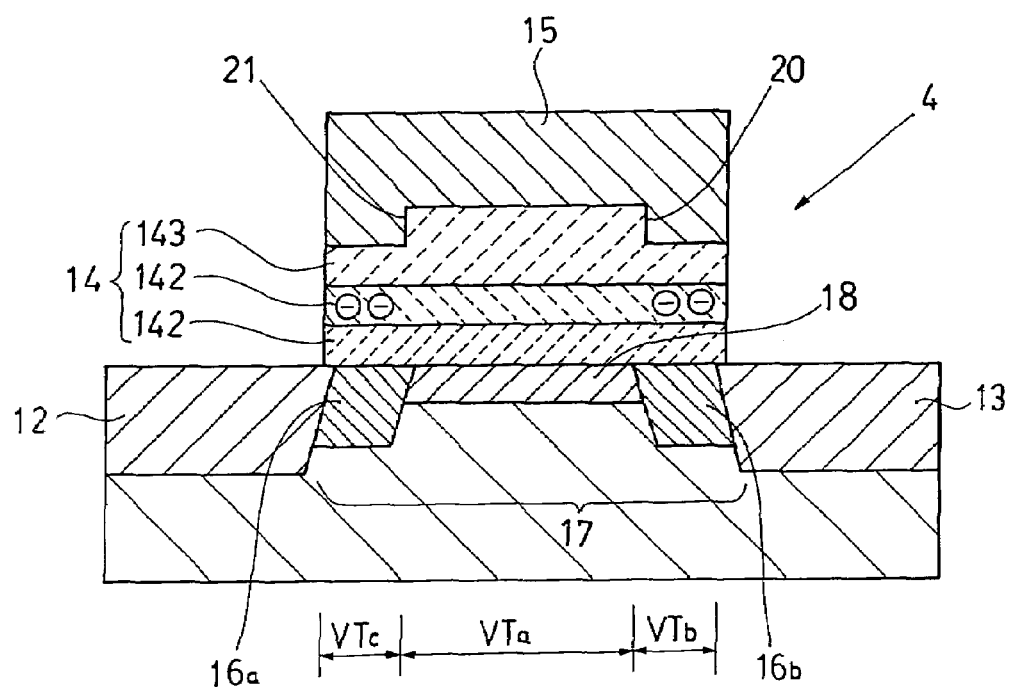

Fourth Embodiment of Non-volatile Semiconductor Memory Device: FIG. 4

FIG. 4 is a schematic cross-sectional view to illustrate a fourth embodiment of the non-volatile semiconductor memory device according to the invention. In FIG. 4, the same reference numerals and symbols are also used to designate portions corresponding to those in FIG. 1 to FIG. 3, and description thereof will be omitted.

The non-volatile semiconductor memory device 4 of the fourth embodiment has substantially the same structure as that of the non-volatile semiconductor memory device 2 shown in FIG. 2, and is different only in that a fourth diffused region 18 of a second conductivity type (n-type) lower in impurity concentration than a source region 12 and a drain region 13 is provided in a region where two heavily doped regions 16a and 16b being third diffused regions are not provided, in a surface layer portion of a channel region 17.

In the non-volatile semiconductor memory device 4, there exist three different threshold voltages, namely, a threshold voltage VTa in the fourth diffused region 18, a threshold voltage VTb in the heavily doped region 16b being the third diffused region, and a threshold voltage VTc in the heavily doped region 16b.

After the erase, negative charge stored in a multilayer film 14 is neutralized by the injection of positive charge, and the threshold voltage VTc in the heavily doped region 16a and the threshold voltage VTb in the heavily doped region 16b come to have sufficiently low values, and accordingly, a threshold voltage VT becomes VT=VTa and comes to have a value determined at the fabrication time of the non-volatile semiconductor memory device 4.

Therefore, by forming the fourth diffused region 18 in the channel region 17, it is possible to lower the threshold voltage VT after the erase to 0 V or lower, which can cause depletion.

However, the threshold voltage VT after the write differs depending on in which one of end portions of the multilayer film 14 the charge is stored, or depending on whether or not charge is stored in the both end portions.

A method of reading the written data is the same as a conventionally tried method of reading in a multi-level memory, and by executing the read twice with a voltage applied to the source region and a voltage applied to the drain region being interchanged, it is possible to read multi-level data.

The non-volatile semiconductor memory device 4 can also be used as a multi-level memory similarly to the non-volatile semiconductor memory device 2 of the second embodiment. Voltage conditions at the time of writing and at the time of erasing are the same as those of the second embodiment.

Embodiment of Semiconductor Memory System:
FIG. 6 to FIG. 10

Next, an embodiment of a semiconductor memory system according to the invention will be described.

Any of the non-volatile semiconductor memory devices of the above-described embodiments according to the invention constantly keeps the semiconductor substrate 11 at 0 V (ground potential), and is capable of writing data by applying the writing voltages with the same polarity to the gate electrode 15 and to the source region 12 or the drain region 13, and is capable of erasing the data by applying the erasing voltage with the same polarity as the polarity of the writing voltages to the gate electrode 15.

An embodiment of the semiconductor memory system for this purpose will be described below.

Here, FIG. 6 and FIG. 7 show examples of voltages applied to respective portions at the time of writing and the time of erasing in the non-volatile semiconductor memory device according to the invention, in comparison to those in non-volatile semiconductor memory devices used in a typical NOR-type circuit and a NAND-type circuit. FIG. 6 shows the type of each applied voltage, namely, positive, negative, or 0 V (ground potential) and FIG. 7 shows examples of concrete voltage values thereof.

The symbols used in these drawings mean the following.
CHE: channel hot electron
FN: to utilize a tunnel effect of charge
VG: gate voltage, VD: drain voltage, VS: source voltage
VB: bulk (semiconductor substrate) voltage, HV: positive voltage, NV: negative voltage
HHV: positive voltage higher than HV As is apparent from FIG. 6 and FIG. 7, the typical NOR-type circuit requires positive and negative power sources, and in the NAND-type circuit, the potential VB of the semiconductor substrate (bulk) changes between 0 V and HV (+7 V). In the non-volatile semiconductor memory device of the invention, the potential VB of the semiconductor substrate (bulk) is constantly 0 V, and the write and the erase can both be executed only with a power source generating the positive voltage.

Figure 8:
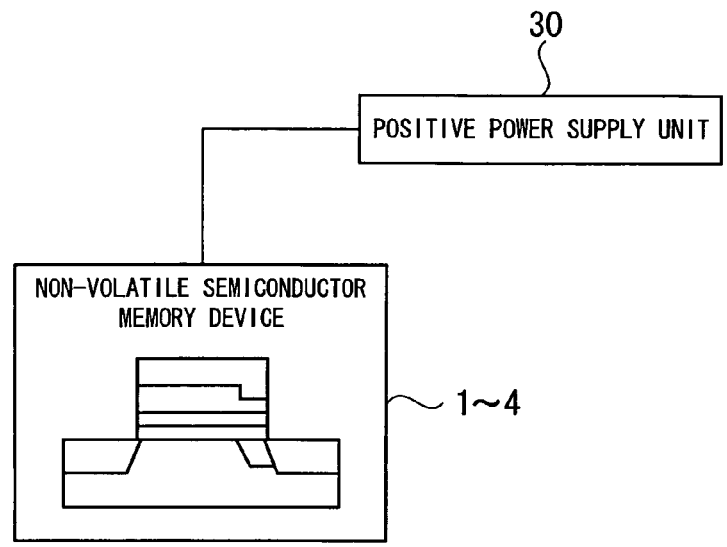
FIG. 8 is a system block diagram showing the basic configuration of a semiconductor memory system according to the invention.

FIG. 8 is a system block diagram showing the basic configuration of the semiconductor memory system according to the invention. This semiconductor memory system includes: one of the above-described non-volatile semiconductor memory devices 1 to 4 according to the invention; and a power supply unit 30 generating positive voltages both as a writing voltage which is applied in case of write it is said data is written to the non-volatile semiconductor memory device and as an erasing voltage which is applied in case of erase it is said written data is erased.

Figure 9:
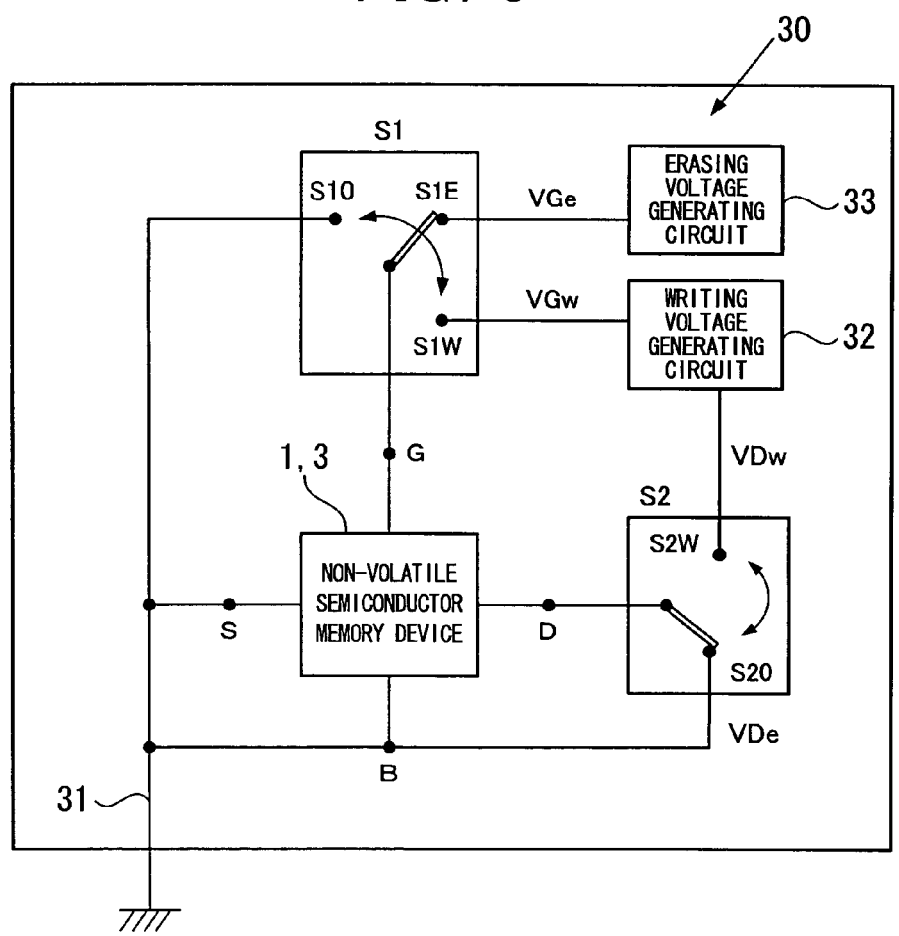
FIG. 9 and FIG. 10 are block diagrams showing different configuration examples of a power supply unit 30 in FIG. 8.

FIG. 9 is a block diagram showing a concrete example of the semiconductor memory system whose non-volatile semiconductor memory device is the non-volatile semiconductor memory device 1 or 3 (hereinafter, 1 is used as a representative) shown in FIG. 1 or FIG. 3. In the drawing, a terminal of the semiconductor substrate 11 of the non-volatile semiconductor memory device 1 is a B terminal, a terminal of the source region 12 being the first diffused region is an S terminal, a terminal of the drain region 13 being the second diffused region is a D terminal, and a terminal of the gate electrode 15 is a G terminal. The portions except the non-volatile semiconductor memory device 1 in an outer frame shown in FIG. 9 constitute the power supply unit 30.

The power supply unit 30 includes: a grounding circuit 31 constantly setting the B terminal and the S terminal of the non-volatile semiconductor memory device 1 to the ground potential; a writing voltage generating circuit 32 generating a writing drain voltage VDw and a writing gate voltage VGw which are applied to the D terminal and the G terminal respectively at the time of writing; an erasing voltage generating circuit 33 generating an erasing gate voltage VGe applied to the G terminal at the time of erasing; and two changeover switches S1, S2.

The writing gate voltage VGw and the writing drain voltage VDw which are generated by the writing voltage generating circuit 32, the erasing gate voltage VGe generated by the erasing voltage generating circuit 33, and an erasing drain voltage VDe applied to the D terminal at the time of erasing are the following voltages.

VGw≧VDw, VGe>VGw. VGw, VGe, and VDw are all positive voltages, and VDe=0 V. In a case where the example of the invention shown in FIG. 7 is implemented, the voltages are set as VGw=+4 V, VDw=+3V, and VGe=8 V.

The writing voltage generating circuit 32 and the erasing voltage generating circuit 33 may be constituted by one circuit. The voltages to be generated may be supplied from an external part, or the voltages VDw (+3 V), VGw (+4 V), and VGe (+8 V) may be generated by an internal boosting circuit based on one low voltage (for example, 1.5 V) supplied from an external part.

The switching states of the changeover switches S1, S2 of this embodiment are as follows.

Write State

A movable contact of the changeover switch S1 is switched to a stationary contact S1W and a movable contact of the changeover switch S2 is switched to a stationary contact S2W. Consequently, the writing gate voltage VGw and the writing drain voltage VDw are applied to the G terminal and the D terminal respectively, and the S terminal and the B terminal become 0 V.

Erase State

As shown in FIG. 9, the movable contact of the changeover switch S1 is switched to a stationary contact S1E and the movable contact of the changeover switch S2 is switched to a stationary contact S20. Consequently, the erasing gate voltage VGe is applied to the G terminal, and the D terminal, the S terminal, and the B terminal become 0 V.

Steady State Where No Write or Erase is Performed

The movable contact of the changeover switch S1 is switched to a stationary contact S10 and the movable contact of the changeover switch S2 is switched to the stationary contact S20. Consequently, the four terminals all become 0 V.

According to this semiconductor memory system, since positive-voltage erase of the non-volatile semiconductor memory device (erase by applying a positive voltage to the gate electrode 15) is possible and there is no need to apply a voltage to the semiconductor substrate 11, it is possible to constantly keep the potential of the semiconductor substrate 11 at 0 V.

Because the potential of the semiconductor substrate is constantly 0 V, element isolation by insulating films is not required in forming a plurality of elements (including elements other than memory elements) on the same semiconductor substrate, which can enhance space efficiency.

Further, in view only of the memory elements, in a system in which the potential of a semiconductor substrate changes, a voltage is uniformly applied not only to a memory element that requires write or erase at a given time but also to other memory elements, and therefore, some measure against erroneous write or erroneous erase is necessary, but the use of this semiconductor memory system eliminates this need.

Further, since the writing voltages and the erasing voltages are also all positive voltages (voltages with the same polarity), the power supply unit is simple in structure and low in cost.

In a case where the non-volatile semiconductor memory device is different from the non-volatile semiconductor memory devices 1, 3 shown in FIG. 1 and FIG. 3 such that the heavily doped region 16 being the third diffused region is provided to be in contact with the source region 12 side and the thin portion of the top oxide film 143 in the multilayer film 14 is positioned at a source region 12-side end portion overlapping with the heavily doped region 16 in a plane view, the structure of the embodiment in FIG. 9 is changed as follows.

The changeover switch S2 is provided on the S terminal side, the movable contact is connected to the S terminal, the stationary contact S2W is connected to a writing source voltage (same as the writing drain voltage VDw) output terminal of the writing voltage generating circuit 32, and the stationary contact S20 is connected to 0 V (ground potential). The D terminal is directly connected to 0 V (ground potential).

With this structure, in the write state, the writing gate voltage VGw and the writing source voltage VSw (same as VDw) are applied to the G terminal and the S terminal respectively, and the D terminal and the B terminal become 0 V. The switching states in the erase state and the steady state are the same as those described above.

Figure 10:
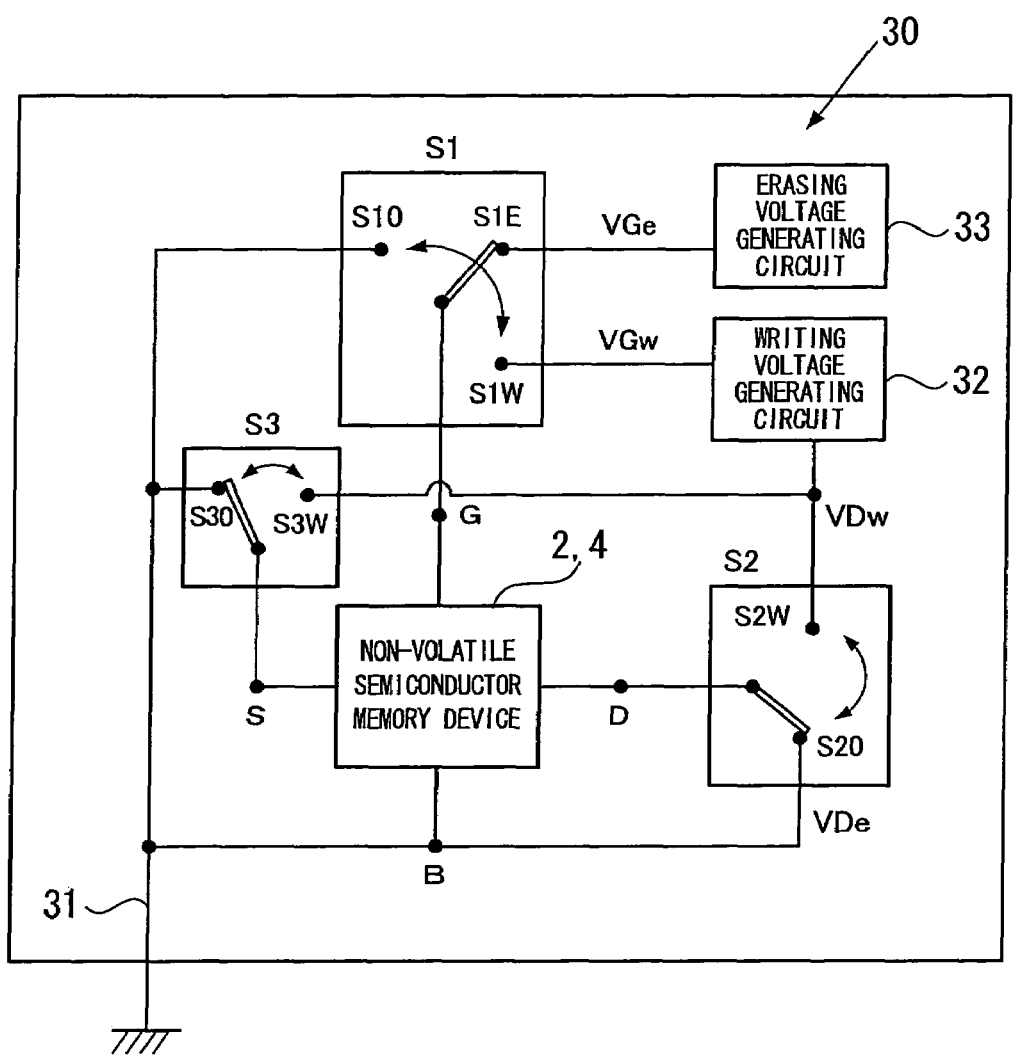

FIG. 10 shows a concrete embodiment of a semiconductor memory system in a case where the non-volatile semiconductor memory device in FIG. 8 is a multi-level memory such as the non-volatile semiconductor memory devices 2, 4 (hereinafter, 2 is used as a representative) in FIG. 2 and FIG. 4 where the heavily doped regions 16a, 16b being the third diffused regions are provided both on the source region 12 side and the drain region 13 side and charges can be stored independently in the both end portions of the multilayer film 14. In FIG. 10, the same reference numerals and symbols are used to designate the same portions as those in FIG. 9, and description thereof will be omitted. For convenience sake, a power supply unit 30 of this embodiment is denoted by the same reference numeral as that of the power supply unit 30 of the embodiment in FIG. 9, though it further includes a changeover switch S3 and thus is different from the power supply unit 30 of the embodiment in FIG. 9.

In the changeover switch S3, a movable contact is connected to an S terminal, a stationary contact S3W is connected to a writing drain voltage VDw (serving also as a writing source voltage) output terminal of a writing voltage generating circuit 32, and a stationary contact S30 is connected to 0 V (ground potential).

Switching states of the changeover switches S1, S2, S3 shown in FIG. 10 are those in an erase state, and in this state, as in the embodiment shown in FIG. 9, an erasing gate voltage VGe is applied to a G terminal, and a D terminal, the S terminal, and a B terminal are all 0V.

In a write state, in a case where data is written to an end portion near the drain region 13 in the multilayer film 14 of the non-volatile semiconductor memory device 2, the movable contact of the changeover switch S1 is switched to the stationary contact S1W and the movable contact of the changeover switch S2 is switched to the stationary contact S2W while the state of the changeover switch S3 in FIG. 10 is kept unchanged. Consequently, the writing gate voltage VGw and the wiring drain voltage VDw are applied to the G terminal and the D terminal respectively, and the S terminal and the B terminal become 0 V. This is also the same as in the embodiment in FIG. 9.

In a case where data is written to the end portion near the source region 12 in the multilayer film 14 of the non-volatile semiconductor memory device 2, the movable contact of the changeover switch S3 is switched to the stationary contact S3W, the movable contact of the changeover switch S3 is switched to the stationary contact S1W, and the movable contact of the changeover switch S2 is switched to the stationary contact S20. Consequently, the writing gate voltage VGw and the writing source voltage (same as the writing drain voltage VDw) are applied to the G terminal and the S terminal respectively, and the D terminal and the B terminal become 0 V.

In a steady state where no write or erase is performed, the movable contact of the changeover switch S1 is switched to the stationary contact S10 from the state shown in FIG. 10. Consequently, the four terminals all become 0 V.

Incidentally, another possible structure is such that the changeover switches S1 to S3 in these embodiments are omitted, the S terminal, the D terminal, and the G terminal of the non-volatile semiconductor memory device are grounded via high resistors, and only at the time of writing, the writing voltage generating circuit 32 generates the writing gate voltage VGw to apply it to the G terminal and also generates the writing drain voltage VDw or the writing source voltage VS to apply it to the D terminal or the S terminal, and only at the time of erasing, the erase voltage generating circuit 33 generates the erasing gate voltage VGe to apply it to the G terminal. When the writing voltage generating circuit 32 and the erasing voltage generating circuit 33 do not generate the voltages, voltage output terminals thereof are set in a high impedance (or open) state.

Incidentally, the embodiments described hitherto are all examples of a case where the first conductivity type which is a conductivity type of the semiconductor substrate 11 of the non-volatile semiconductor memory device is the p-type, the second conductivity type which is a conductivity type of the source region 12 being the first diffused region and the drain region 13 being the second diffused region is the n-type, the conductivity type of the heavily doped region 16 (or 16a, 16b) being the third diffused region is accordingly the p-type, and the conductivity type of the fourth diffused region 18 is the n-type, but when these conductivity types are reversed, that is, when the first conductivity type is the-n type and the second conductivity type is the p-type, it is also possible to construct each of the non-volatile semiconductor memory devices according to the invention and to obtain the same effects.

However, voltages, except 0 V, applied to the terminals of the non-volatile semiconductor memory devices at the write, erase, and time of readings are all equal in absolute value but all opposite in polarity to those in the above-described embodiments. Therefore, in a case where a system similar to the semiconductor memory systems described with reference to FIG. 8 to FIG. 10 is constructed by using a non-volatile semiconductor memory device in which conductivity types are thus opposite, the voltages generated by the power supply unit 30 to be applied to the terminals of the non-volatile semiconductor memory device are all negative voltages. However, the absolute values of the voltages are equal to those in the above-described embodiments.

Therefore, the basic structure as shown in FIG. 8 of the semiconductor memory system according to the invention includes: the non-volatile semiconductor memory device according to the invention; and a power supply unit that generates voltages with the same polarity as a writing voltage applied in case of write it is said data is written to the non-volatile semiconductor memory device and as an erasing voltage applied in case of erase it is said the written data is erased.

Further, the structure common to the power supply units is that each has: a grounding circuit which constantly sets the semiconductor substrate 11 of the non-volatile semiconductor memory device to the ground potential; a writing voltage generating circuit which generates positive or negative writing voltages applied to the first diffused region (source region 12) or the second diffused region (drain region 13) and to the gate electrode 15 at the time of writing; and an erasing voltage generating circuit which generates an erasing voltage larger in absolute value than and equal in polarity to the writing voltages to apply the erasing voltage to the gate electrode 15 at the time of erasing.

The non-volatile semiconductor memory devices according to the invention of course are capable of performing the write and erase under the voltage conditions shown as examples in the description of the first and second embodiments. However, in this case, since the gate voltage at the time of erasing is a voltage different in polarity from the source voltage or the drain voltage and the gate voltage at the time of writing, this semiconductor memory system is not constructed.

First Embodiment of Fabricating Method of Semiconductor Memory Device: FIG. 11 to FIG. 16

Next, a first embodiment of a fabricating method of a non-volatile semiconductor memory device according to the invention will be described with reference to FIG. 11 to FIG. 16. FIG. 11 to FIG. 16 are schematic cross-sectional views, similar to FIG. 2, to illustrate steps thereof, and the same reference numerals and symbols are used to designate portions corresponding to those in FIG. 2.

Figure 11:
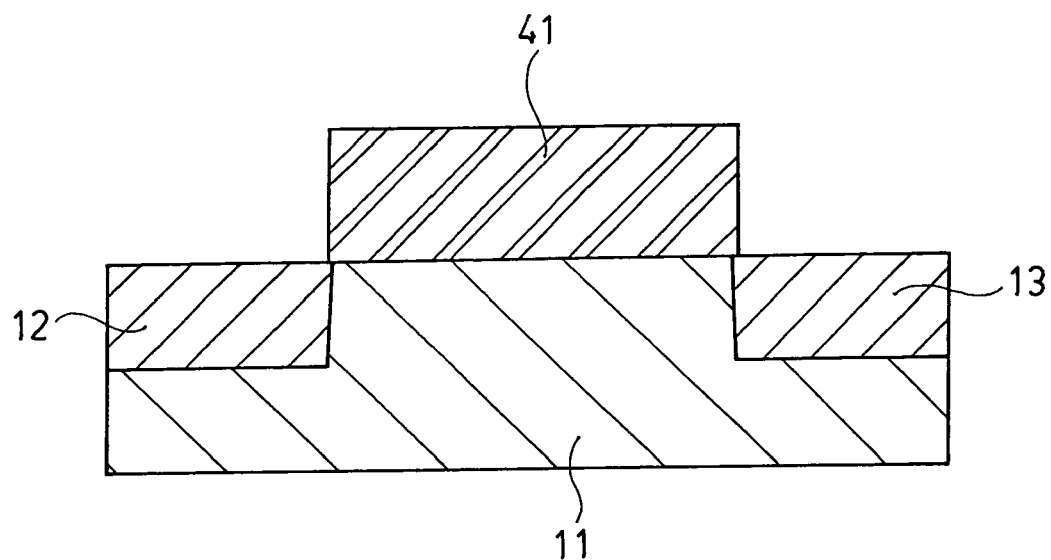
FIG. 11 to FIG. 16 are schematic cross-sectional views to illustrate steps in a first embodiment of a fabricating method of the non-volatile semiconductor memory device according to the invention.

First, as shown in FIG. 11, a photoresist 41 is formed on the semiconductor substrate 11 of the first conductivity type (p-type) by using a known photolithography technique. Here, a region on which the photoresist 41 is formed is a region excluding regions where the source region 12 and the drain region 13 are to be formed.

Next, the source region 12 and the drain region 13 by diffused regions of the second conductivity type (n-type) are formed apart from each other by a known ion implantation. Thereafter, the photoresist 41 is removed by wet etching.

Figure 12:
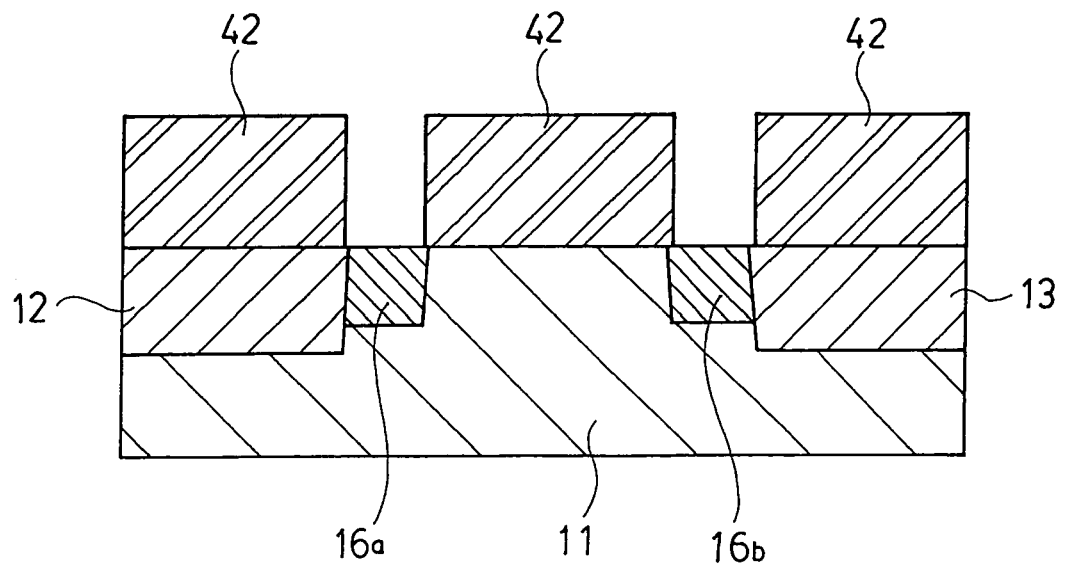

Next, as shown in FIG. 12, a photoresist 42 is formed on the semiconductor substrate 11 by using a known photolithography technique. Here, regions on which the photoresist 42 is formed are regions excluding regions where the first heavily doped region 16a and the second heavily doped region 16b are to be formed. Further, the photoresist 42 covers upper portions of the source region 12 and the drain region 13.

Next, by a known ion implantation, the first heavily doped region 16a and the second heavily doped region 16b of the first conductivity type (p-type) which are higher in impurity concentration than the semiconductor substrate 11 are formed in part of a region between the source region 12 and the drain region 13. The first heavily doped region 16a is formed so as to be in contact only with the source region 12 being the first diffused region, and the second heavily doped region 16b is formed so as to be in contact only with the drain region 13 being the second diffused region.

Thereafter, the photoresist 42 is removed by wet etching.

Figure 13:
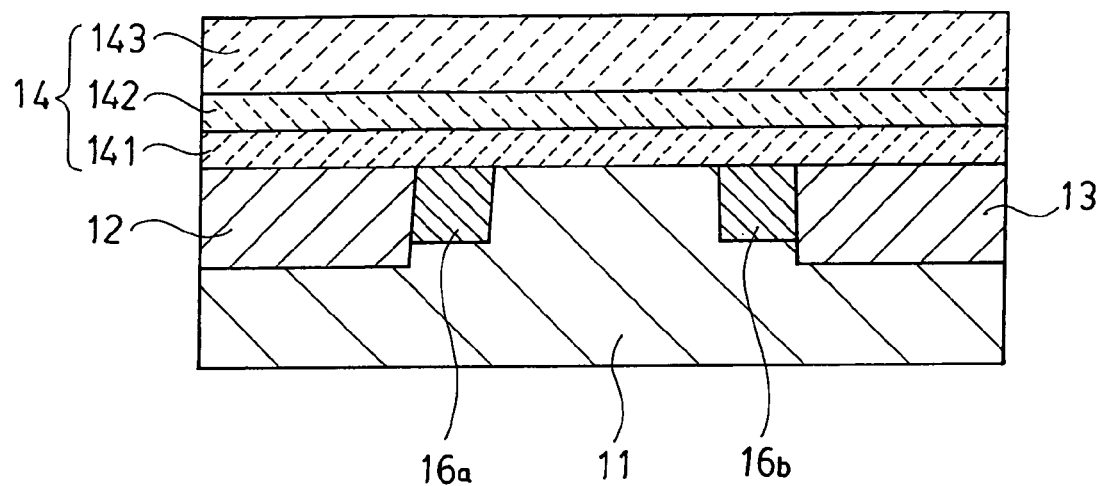

Next, as shown in FIG. 13, a plurality of insulating films are stacked on the semiconductor substrate 11 to form the multilayer film 14. Specifically, first, the tunnel oxide film 141 is formed all over a surface of the semiconductor substrate 11 by a first oxide film forming step. Next, the memory nitride film 142 is formed all over a surface of the tunnel oxide film 141 by a nitride film forming step, and the top oxide film 143 is formed all over a surface of the memory nitride film 142 by a second oxide film forming step.

The first oxide film forming step uses a known oxidation method. For example, the tunnel oxide film 141 is formed by thermal oxidation in an atmosphere of a mixture of oxygen ($O_2$) and nitrogen ($N_2$). In the nitride film forming step, the memory nitride film 142 is formed by, for example, a CVD method using dichlorosilane ($SiH_2Cl_2$) and ammonia ($NH_3$) as reactive gas. In the second oxide film forming step, the top oxide film 143 is formed by thermal oxidation in a vapor atmosphere using an oxidation/diffusion furnace.

Next, a step of forming the stepped portions in the top oxide film 143 will be described by using FIG. 14. First, a photoresist 43 is formed on the top oxide film 143 by using a known photolithography technique. Here, a region on which the photoresist 43 is formed is a region of the top oxide film 143 right under which neither of the first heavily doped region 16a and the second heavily doped region 16b exists, in a region between the source region 12 and the drain region 13, that is, a region where the top oxide film 143 is desired to be thick.

Next, by using the photoresist 43 as a mask, the top oxide film 143 is removed by using a dry etching technique. Consequently, as shown in FIG. 14, in a portion between the source region 12 and the drain region 13 in the top oxide film 143, portions overlapping with the first heavily doped region 16a and the second heavily doped region 16b in a plane view become thinner than the other portion. Consequently, in the top oxide film 143, the stepped portion 20 is formed above an inner boundary portion of the second heavily doped region 16b, and the stepped portion 21 is formed above an inner boundary portion of the first heavily doped region 16a.

A removal amount of the top oxide film 143 by this step can be freely selected. Specifically, a thickness difference between the portion right under which the first heavily doped region 16a or the second heavily doped region 16b exists and the portion right under which neither of them exists is selected according to an electrical characteristic of the non-volatile semiconductor memory device. In a case where a multi-level memory is constructed, this film thickness and impurity concentration of the heavily doped regions are especially important.

After the stepped portions 20, 21 are thus formed in the top oxide film 143, the photoresist 43 is removed by wet etching.

Figure 15:
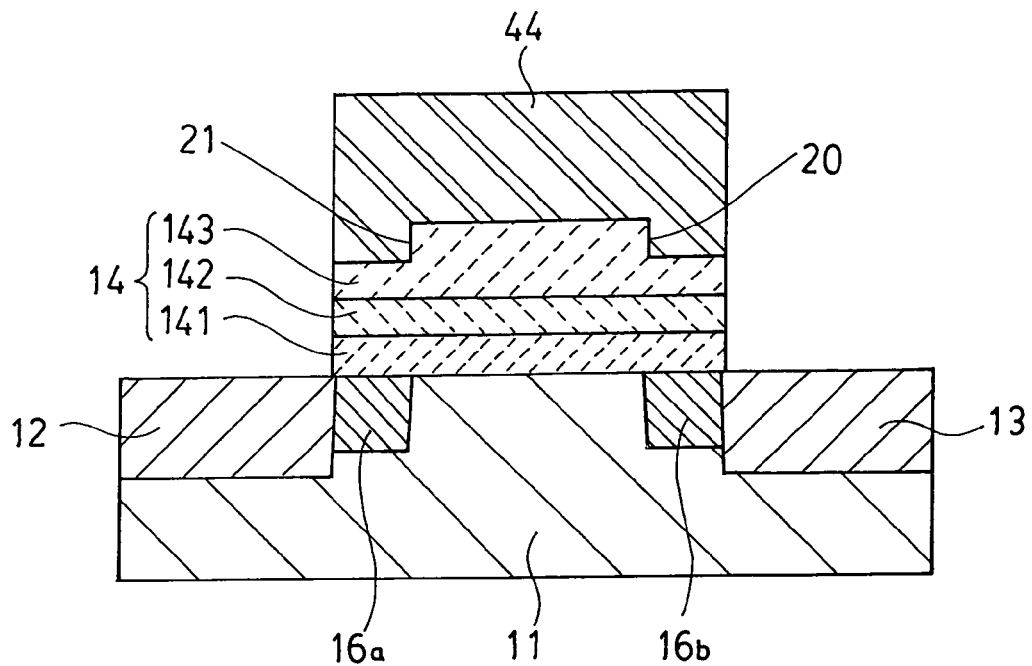

Next, as shown in FIG. 15, a photoresist 44 is formed on the top oxide film 143 by using a known photolithography technique. Then, by using the photoresist 44 as a mask, the top oxide film 143, the memory nitride film 142, and the tunnel oxide film 141 constituting the multilayer film 141 are removed by dry etching.

By this step, the multilayer film 14 is shaped, whereby the multilayer film 14 is formed only on top of the channel region between the source region 12 and the drain region 13. Thereafter, the photoresist 44 is removed by wet etching.

Figure 16:
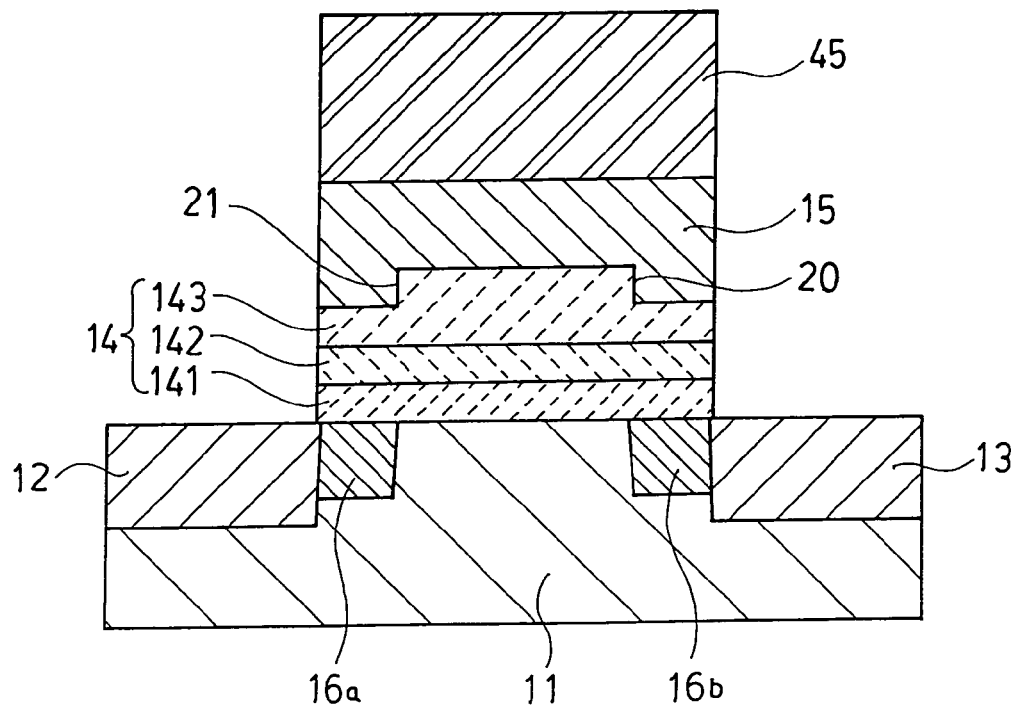

Next, a step of forming the gate electrode will be described with reference to FIG. 16.

First, a polysilicon film, though not shown, used to form the gate electrode is formed all over an upper surface of the semiconductor substrate 11 by using a CVD method. Thereafter, a photoresist 45 is formed on a portion where the gate electrode is desired to be formed, by using a known photolithography technique, and by using the photoresist 45 as a mask, the polysilicon film is dry-etched. By this step, the gate electrode 15 is formed on top of the multilayer film 14 as shown in FIG. 16.

Thereafter, the photoresist 45 is removed by wet etching. Consequently, the structure of the non-volatile semiconductor memory device 2 shown in FIG. 2 usable as the multi-level memory is completed. Thereafter, by using a known technique, interlayer insulating films, various wirings, and so on which are not shown, are formed, whereby a semiconductor device having the non-volatile semiconductor memory device 2 is completed.

Incidentally, to fabricate the non-volatile semiconductor memory device 1 shown in FIG. 1 or a non-volatile semiconductor memory device in which the heavily doped region 16 is provided only on the source region 12 side, the above-described fabricating method is changed as follows.

Specifically, in the step of forming the heavily doped regions described with reference to FIG. 12, one heavily doped region 16 of the first conductivity type (p type) higher in impurity concentration than the semiconductor substrate is formed in part of the region between the source region 12 and the drain region 13 in the semiconductor substrate 11 so as to be in contact only with one of the source region and the drain region.

Figure 14:
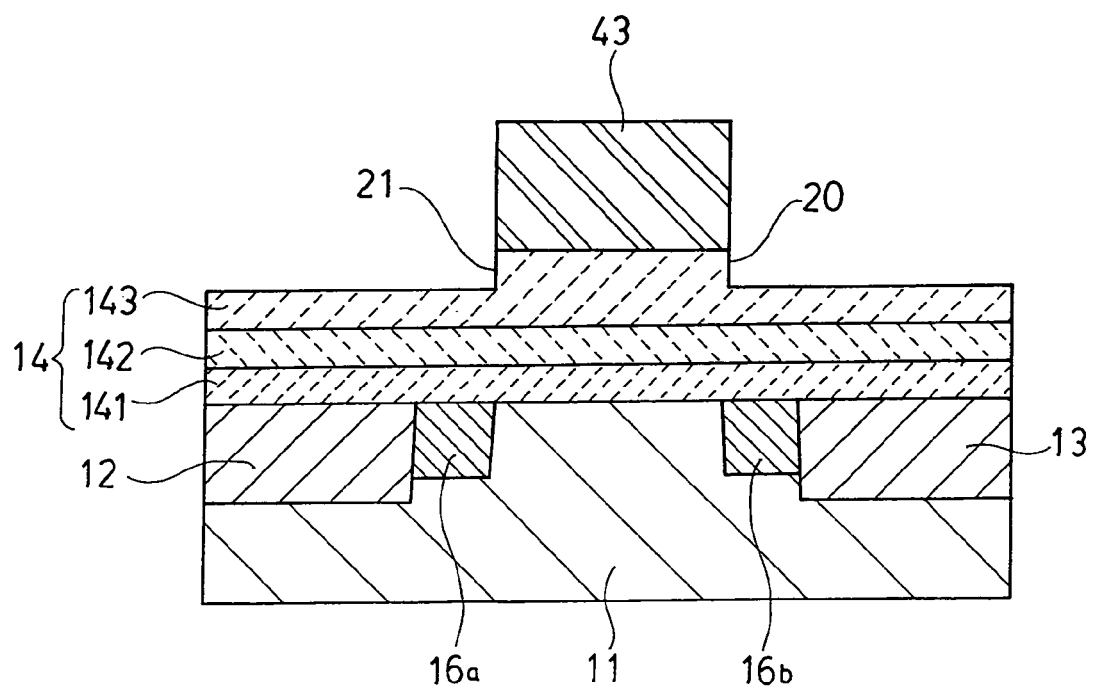

Then, in the step of forming the stepped portions in the top oxide film 143 described by using FIG. 14, the photoresist 43 is formed on a region of the top oxide film 143 right under which the heavily doped region 16 does not exist, in the region between the source region 12 and the drain region 13. That is, the photoresist 43 is formed up to the upper side of the heavily doped region 16a or 16b in FIG. 14.

Then, by using the photoresist 43 as a mask, the top oxide film 143 is removed by etching, and in the portion between the source region 12 and the drain region 13 in the top oxide film 143, a portion overlapping with the heavily doped region 16 in a plane view is made thinner than the other portion. Consequently, in the top oxide film 143, one stepped portion 20 or 21 is formed above the inner boundary portion of the heavily doped region 16.

Incidentally, to fabricate the non-volatile semiconductor memory device 4 shown in FIG. 4 or the non-volatile semiconductor memory device 3 shown in FIG. 3, another step in addition to the above-described steps is further provided in which a diffused region of a second conductivity type (fourth diffused region 18) lower in impurity concentration than the source region 12 and the drain region 13 is formed in a region where the first and second heavily doped regions 16a, 16b are not provided or the one heavily doped region 16 is not provided, between the source region 12 and the drain region 13 of the semiconductor substrate 11. This step is executed prior to the step of forming the multilayer film 14 on the semiconductor substrate 11.

Second Embodiment of Fabricating Method of Semiconductor Memory Device: FIG. 17 to FIG. 22

Next, a second embodiment of the fabricating method of the non-volatile semiconductor memory device according to the invention will be described with reference to FIG. 17 to FIG. 22. FIG. 17 to FIG. 22 are schematic cross-sectional views, similar to FIG. 2, to illustrate steps thereof, and the same reference numerals and symbols are used to designate portions corresponding to those in FIG. 2.

Figure 17:
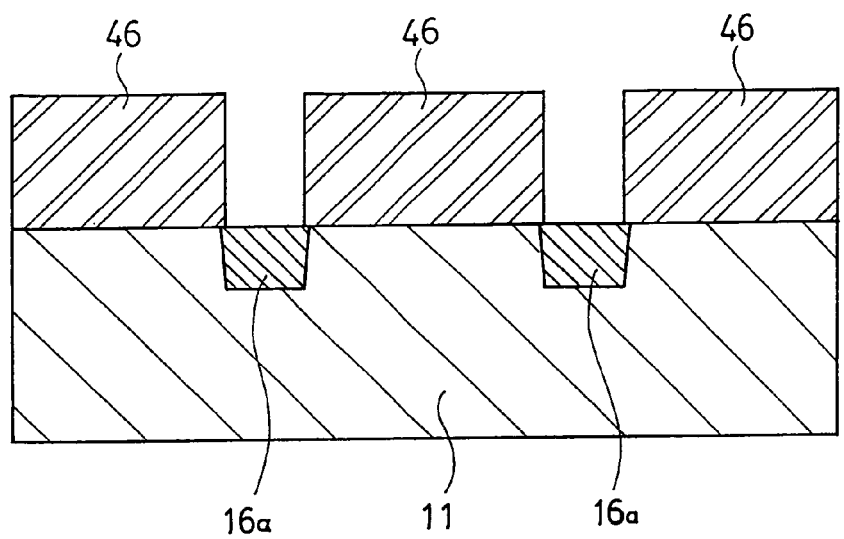
FIG. 17 to FIG. 22 are schematic cross-sectional views to illustrate steps in a second embodiment of the fabricating method of the non-volatile semiconductor memory device according to the invention.

First, as shown in FIG. 17, a photoresist 46 is formed on the semiconductor substrate 11 of the first conductivity type (p-type) by a known photolithography technique. Here, regions on which the photoresist 46 is formed are regions except two regions where the first heavily doped region 16a and the second heavily doped region 16b apart from each other are to be formed.

Next, by a known ion implantation, the first heavily doped region 16a and the second heavily doped region 16b by the diffused regions of the second conductivity type (n-type) are formed apart from each other. Thereafter, the photoresist 46 is removed by wet etching.

Figure 18:
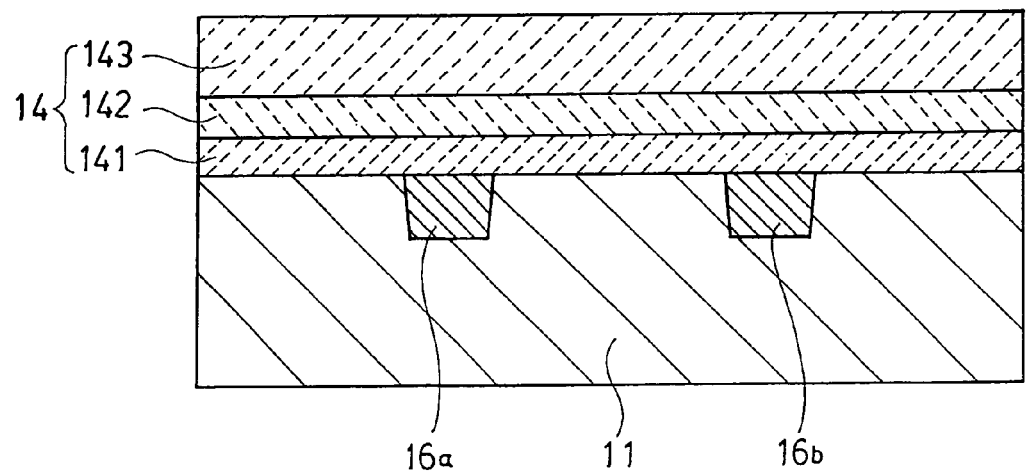

Next, as shown in FIG. 18, the plural insulating films are stacked on the semiconductor substrate 11, whereby the multilayer film 14 is formed. Specifically, the tunnel oxide film 141 is first formed on the surface of the semiconductor substrate 11 by using a first oxide film forming step. Next, the memory nitride film 142 is formed on the whole surface of the tunnel oxide film 141 by a nitride film forming step, and the top oxide film 143 is formed on the whole surface of the memory nitride film 142 by a second oxide film forming step.

These first oxide film forming step, nitride film forming step, and second oxide film forming step are the same as those of the above-described first embodiment.

Figure 19:
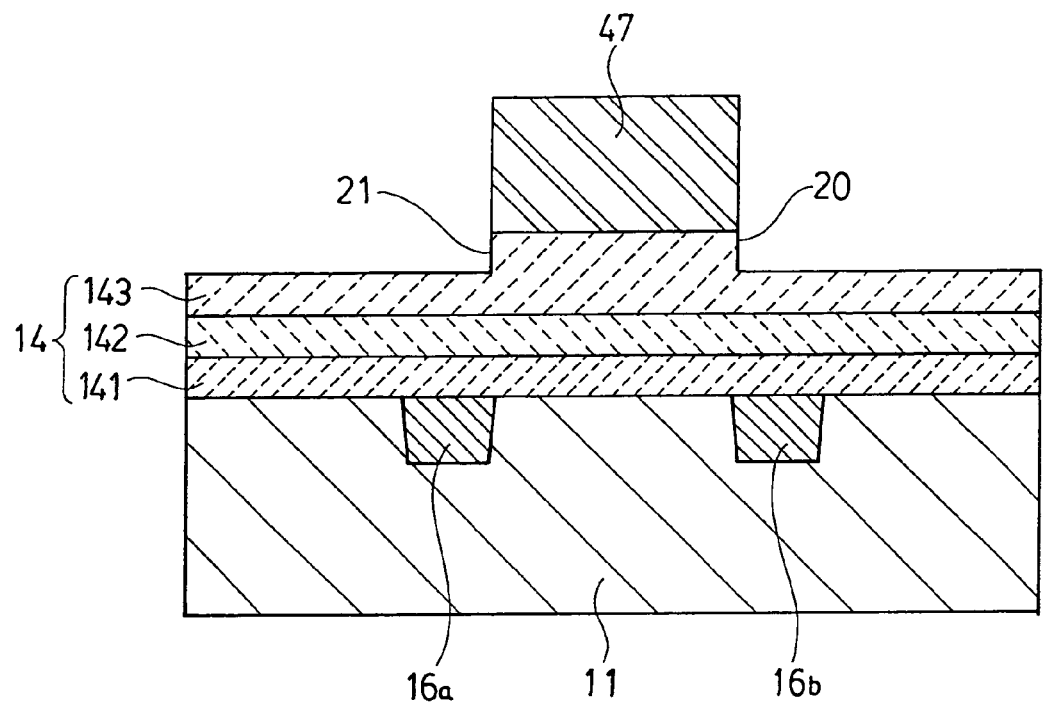

Next, a step of forming the stepped portions in the top oxide film 143 will be described by using FIG. 19.

First, a photoresist 47 is formed on the top oxide film 143 by a known photolithography technique. Here, a region on which the photoresist 47 is formed is a region of the top oxide film 143 right under which the first heavily doped region 16a or the second heavily doped region 16b does not exist, that is, a region, in the top oxide film 143, that is desired to be thick.

Next, by using the photoresist 47 as a mask, the top oxide film 143 is removed by using a dry etching technique. Consequently, as shown in FIG. 19, in a portion, in the top oxide film 143, between regions where the source region 12 and the drain region 13 apart from each other are to be formed in a post-process, portions overlapping with the first heavily doped region 16a and the second heavily doped region 16b respectively in a plane view become thinner than the other portion. Consequently, in the top oxide film 143, the stepped portion 20 is formed above the inner boundary portion of the second heavily doped region 16b and the stepped portion 21 is formed above the inner boundary portion of the first heavily doped region 16a.

A removal amount of the top oxide film 143 by this step can be freely selected as described previously in the first embodiment. After the stepped portions 20, 21 are thus formed in the top oxide film 143, the photoresist 47 is removed by wet etching.

Figure 20:
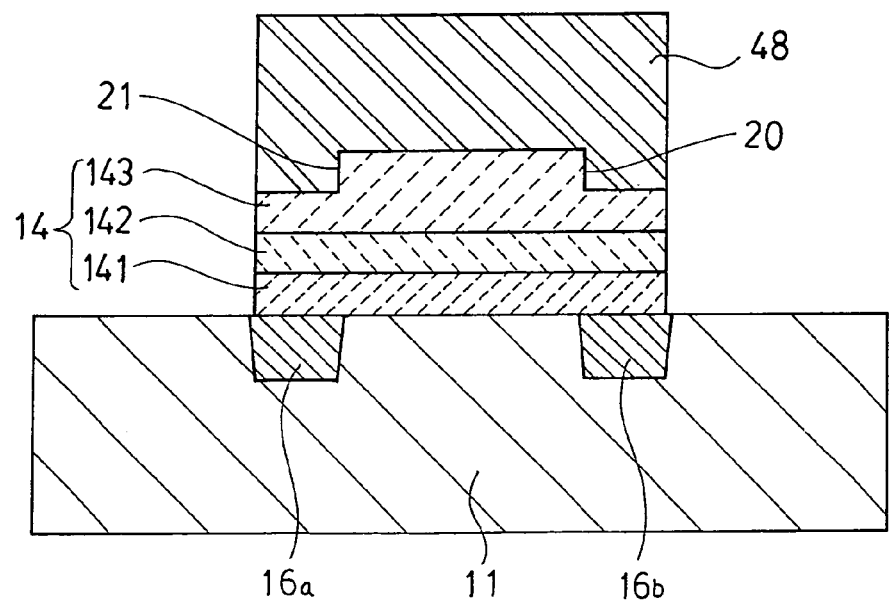

Next, as shown in FIG. 20, a photoresist 48 is formed on the top oxide film 143 by using a known photolithography technique. Then, by using the photoresist 48 as a mask, the top oxide film 143, the memory nitride film 142, and the tunnel oxide film 141 constituting the multilayer film 14 are removed by dry etching.

The multilayer film 14 is shaped by this step, whereby the multilayer film 14 is formed only on top of the region, in the semiconductor substrate 11, between the regions where the source region 12 and the drain region 13 apart from each other are to be formed in the post-process. Thereafter, the photoresist 44 is removed by wet etching.

Figure 21:
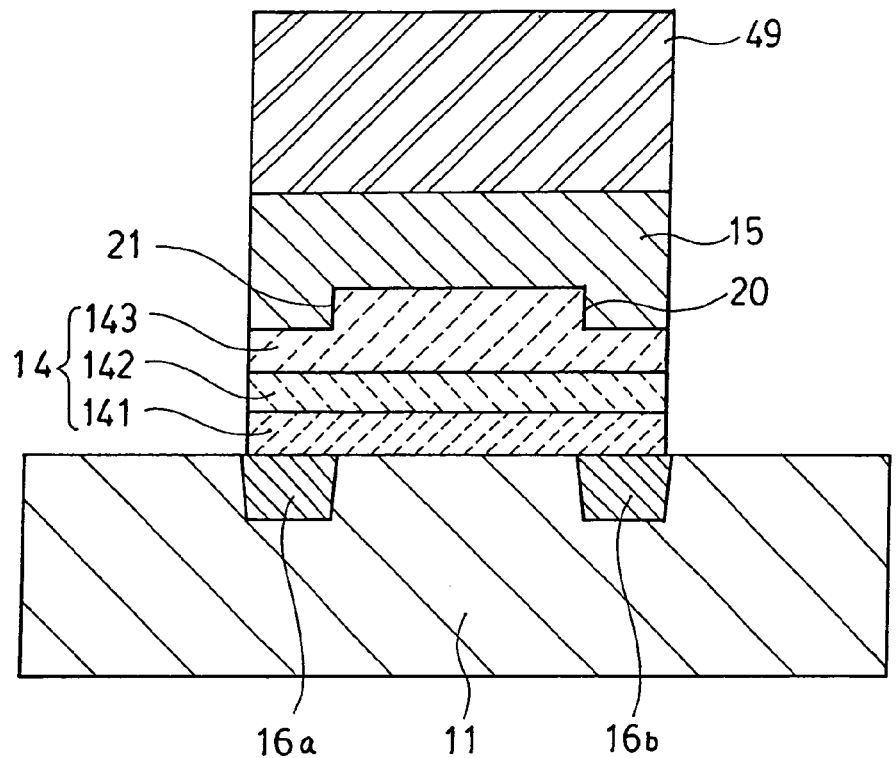

Next, a step of forming the gate electrode will be described with reference to FIG. 21.

First, a polysilicon film, though not shown, used to form the gate electrode is formed on the whole upper surface of the semiconductor substrate 11 by, for example, a CVD method using monosilane ($SiH_4$) as reactive gas.

Thereafter, a photoresist 49 is formed on a portion on which the gate electrode is desired to be formed, by using a known photolithography technique, and by using the photoresist 49 as a mask, the polysilicon film is dry-etched. By this step, the gate electrode 15 is formed on top of the multilayer film 14 as shown in FIG. 21. Thereafter, the photoresist 49 is removed by wet etching, whereby the gate electrode 15 is completed on the multilayer film 14 as shown in FIG. 22.

Figure 22:
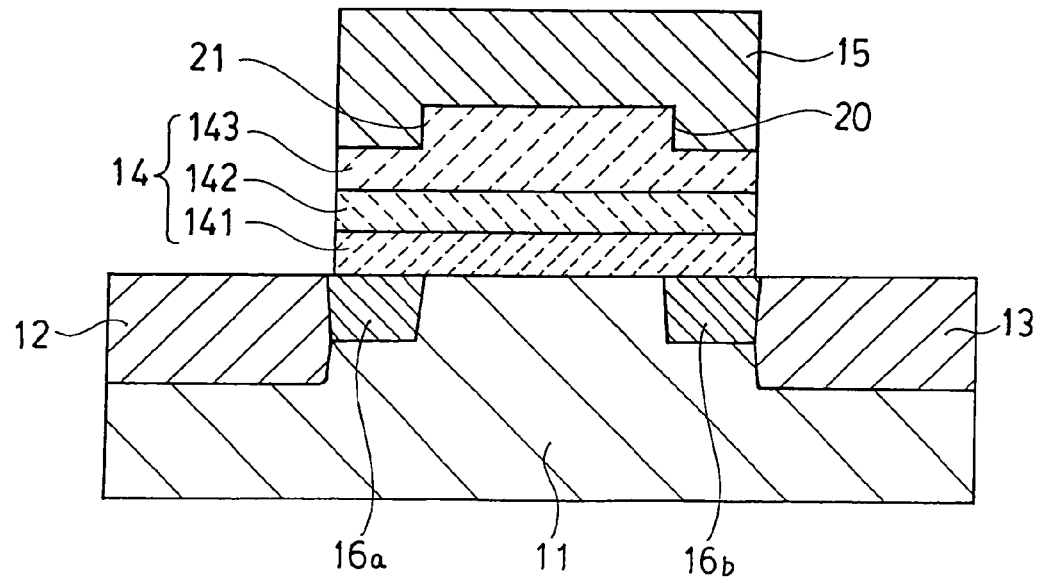
Figure 23:
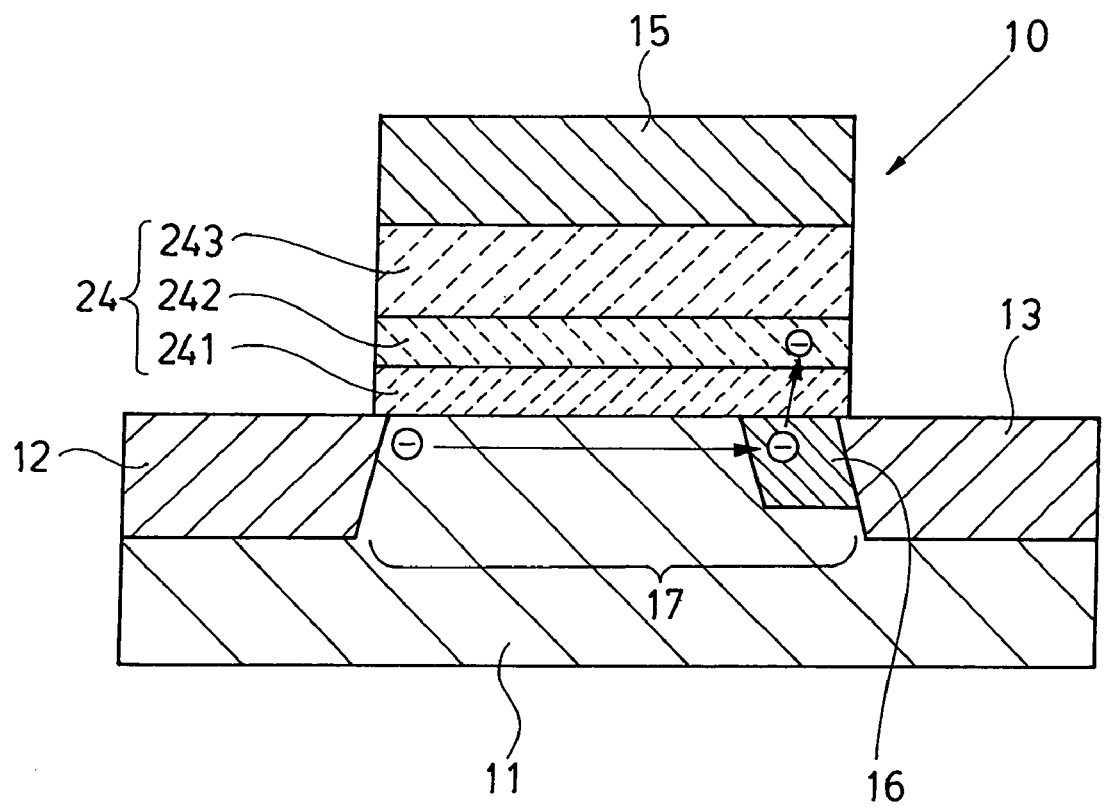
FIG. 23 is a schematic cross-sectional view to illustrate an example of a prior non-volatile semiconductor memory device.

Next, the source region 12 and the drain region 13 by the diffused regions of the second conductivity type (n-type) facing each other across the heavily doped regions 16a, 16b are formed near the surface of the semiconductor substrate 11 by a known ion implantation so that the source region 12 is in contact only with the heavily doped region 16a and the drain region is in contact only with the other heavily doped region 16b as shown in FIG. 22. Consequently, the structure of the non-volatile semiconductor memory device 2 shown in FIG. 2 usable as a multi-level memory is completed. Thereafter, by using a known technique, interlayer insulating films, various wirings, and so on, which are not shown, are formed, whereby a semiconductor device having the non-volatile semiconductor memory device 2 of the invention is completed.

Incidentally, to fabricate the non-volatile semiconductor memory device 1 shown in FIG. 1 or a non-volatile semiconductor memory device in which the heavily doped region 16 is provided only on the source region 12 side, the above-described fabricating method is changed as follows.

Specifically, in the step of forming the heavily doped regions described with reference to FIG. 17, one heavily doped region of the first conductivity type (p-type) higher in impurity concentration than the semiconductor substrate 11 is formed near the surface of the semiconductor substrate of the first conductivity type.

Further, in the step of forming the stepped portions in the top oxide film 143 described with reference to FIG. 19, the photoresist 47 is formed on a region of the top oxide film 143 right under which the heavily doped region 16 does not exist, between the regions in which the source region 12 and the drain region 13 apart from each other are to be formed in a post-process. That is, the photoresist 47 is formed up to the top of the heavily doped region 16a or 16b in FIG. 19.

Then, by using the photoresist 47 as a mask, the top oxide film 143 is removed by etching, and in the portion, in the top oxide film 143, between the regions in which the source region 12 and the drain region 13 apart from each other are to be formed in the post-process, a portion overlapping with the heavily doped region 16 in a plane view is made thinner than the other portion. Consequently, in the top oxide film 143, one stepped portion 20 or 21 is formed above the inner boundary portion of the heavily doped region 16.

Further, to fabricate the non-volatile semiconductor memory device 4 shown in FIG. 4 or the non-volatile semiconductor memory device 3 shown in FIG. 3, another step in addition to the above-described steps is provided in which a diffused region (fourth diffused region 18) of the second conductivity type lower in impurity concentration than the source region 12 and the drain region 13 is formed in a region excluding the regions provided with the first and second heavily doped regions 16a, 16b or the one heavily doped region 16, between the regions in the semiconductor substrate 11 where the source region 12 and the drain region 13 apart from each other are to be formed in the post process. This step is executed prior to the step of forming the multilayer film 14 on the semiconductor substrate 11.

The above embodiments have described, as examples, the cases where the first conductivity type of the semiconductor substrate is the p-type, and the second conductivity type of the source region 12 and drain region 13 being the first and second diffused regions is the n-type, but the first conductivity type may be the n-type and the second conductivity type may be the p-type as previously described.

Incidentally, the shapes of the source region 12, the drain region 13, and the heavily doped regions 16a, 16b in the drawings showing the steps, which are used to describe these embodiments of the fabricating method, are slightly different from the shapes of those of the non-volatile semiconductor memory device shown in FIG. 2 or FIG. 4, but these drawings are only schematic views and do not show accurate shapes. The shapes of the boundary portions of these diffused regions change variously depending on the condition of diffusion and the like.

INDUSTRIAL APPLICABILITY

The non-volatile semiconductor memory device of the invention is capable of surely writing data even when a writing gate voltage is lowered, and therefore is capable of coping with a decrease in voltage of semiconductor devices. Further, since a gate voltage at the time of reading can be small and can be made 0 V, deterioration of stored data due to erroneous write can be prevented, which enables application to a storage device for electronic equipment requiring reliability. Further, being capable of realizing a highly reliable multi-level memory, the non-volatile semiconductor memory device is also suitably used in computer apparatuses and electronic equipment requiring high integration degree.

Further, since the semiconductor memory system of the invention is capable of constantly setting the potential of the semiconductor substrate 11 to 0 V, element isolation by insulating films is not required when a plurality of elements are formed on the same semiconductor substrate, which can enhance space efficiency of semiconductor devices. Further, since the writing voltages and the erasing voltages can all be voltages with the same polarity, the power supply unit is simple in structure and low in cost.

What is claimed is:

1. A non-volatile semiconductor memory device comprising:
- a first diffused region and a second diffused region of a second conductivity type which are disposed apart from each other near a surface of a semiconductor substrate of a first conductivity type;
- a multilayer film including a charge storage layer, the multilayer film being composed of a plurality of insulating films vertically stacked on a channel region between the first diffused region and the second diffused region of the semiconductor substrate; and
- a gate electrode provided on top of the multilayer film,
- wherein at least one third diffused region of the first conductivity type which is in contact with only one of the first diffused region and the second diffused region and is higher in impurity concentration than the semiconductor substrate is provided in part of the channel region, and
- wherein, in an insulating film on an uppermost layer out of the plural insulating films composing the multilayer film, only a portion overlapping with the third diffused region in a plane view is smaller in thickness than a portion not overlapping with the third diffused region in the plane view.

2. The non-volatile semiconductor memory device according to claim 1,
- wherein the third diffused region is provided in each of a region in contact only with the first diffused region and a region in contact only with the second diffused region.

3. The non-volatile semiconductor memory device according to claim 2,
- wherein a fourth diffused region of the second conductivity type lower in impurity concentration than the first diffused region and the second diffused region is provided in a region between the two third diffused regions in the channel region.

4. The non-volatile semiconductor memory device according to claim 1,
- wherein the insulating film on the uppermost layer composing the multilayer film has a stepped portion above a boundary portion between the channel region and the third diffused region.

5. The non-volatile semiconductor memory device according to claim 1,
- wherein the multilayer film is composed of a tunnel oxide film, a memory nitride film, and a top oxide film which are stacked in order from a bottom layer, and the top oxide film is the insulating film on the uppermost layer.

6. The non-volatile semiconductor memory device according to claim 1,
- wherein a fourth diffused region of the second conductivity type lower in impurity concentration than the first diffused region and the second diffused region is provided in a region in which the third diffused region is not provided, in the channel region between the first diffused region and the second diffused region.

* * * * *